(12) United States Patent
Schulze et al.

(10) Patent No.: US 10,665,687 B2
(45) Date of Patent: May 26, 2020

(54) METHOD FOR PROCESSING A SEMICONDUCTOR DEVICE AND SEMICONDUCTOR DEVICE

(71) Applicant: Infineon Technologies AG, Neubiberg (DE)

(72) Inventors: Hans-Joachim Schulze, Taufkirchen (DE); Andreas Haertl, Munich (DE); Francisco Javier Santos Rodriguez, Villach (AT); André Rainer Stegner, Munich (DE); Daniel Schloegl, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 383 days.

(21) Appl. No.: 15/465,688

(22) Filed: Mar. 22, 2017

(65) Prior Publication Data
US 2017/0194450 A1    Jul. 6, 2017

Related U.S. Application Data

(62) Division of application No. 14/284,460, filed on May 22, 2014, now Pat. No. 9,653,296.

(51) Int. Cl.
*H01L 21/02* (2006.01)
*H01L 29/47* (2006.01)
(Continued)

(52) U.S. Cl.
CPC .......... *H01L 29/47* (2013.01); *H01L 21/0435* (2013.01); *H01L 21/28512* (2013.01); *H01L 21/28537* (2013.01)

(58) Field of Classification Search
CPC ............ H01L 29/47; H01L 21/28537; H01L 21/823493; H01L 21/823892; H01L 23/043; H01L 27/0925; H01L 27/0927; H01L 27/0928; H01L 29/122; H01L 29/15; H01L 29/66674; H01L 29/7782; H01L 29/7801; H01L 29/803; H01L 31/035236;
(Continued)

(56) References Cited

U.S. PATENT DOCUMENTS 3,672,984 A   6/1972   Sato et al.
3,848,260 A   11/1974  Tsunemitsu et al.
(Continued)

FOREIGN PATENT DOCUMENTS

CN       1245587 A    2/2000
CN       101540283 A  9/2009
(Continued)

*Primary Examiner* — Cuong B Nguyen
*Assistant Examiner* — Samuel Park
(74) *Attorney, Agent, or Firm* — Viering, Jentschura & Partner MBB

(57) ABSTRACT

A method for processing a semiconductor device in accordance with various embodiments may include: depositing a first metallization material over a semiconductor body; performing a heating process so as to form at least one region in the semiconductor body including a eutectic of the first metallization material and material of the semiconductor body; and depositing a second metallization material over the semiconductor body so as to contact the semiconductor body via the at least one region in the semiconductor body.

19 Claims, 10 Drawing Sheets

(51) Int. Cl.
*H01L 21/285* (2006.01)
*H01L 21/04* (2006.01)

(58) Field of Classification Search
CPC ........... H01L 21/02603; H01L 29/0669; H01L 29/413; H01L 2221/1094; H01L 2924/13086; H01L 2224/08502; H01L 2224/08506; H01L 2224/16502; H01L 2224/16506; H01L 2224/32502; H01L 2224/32506; H01L 2224/40506; H01L 2224/48506; H01L 2224/80805; H01L 2224/81805; H01L 2224/82805; H01L 2224/83805; H01L 2224/84805; H01L 2224/85805; H01L 2224/86805; H01L 2924/01322; H01L 2924/01323; H01L 2924/01324
See application file for complete search history.

(56) References Cited

U.S. PATENT DOCUMENTS

| | | | |
|---|---|---|---|
| 3,945,111 A | 3/1976 | Greeson et al. | |
| 4,980,020 A * | 12/1990 | Douglas | H01L 21/76895 257/E21.309 |
| 5,384,485 A * | 1/1995 | Nishida | H01L 21/28518 257/382 |
| 6,066,547 A * | 5/2000 | Maekawa | H01L 21/2022 257/E21.133 |
| 6,452,244 B1 | 9/2002 | Miura et al. | |
| 6,521,515 B1 * | 2/2003 | Kluth | H01L 21/28518 257/E21.165 |
| 8,288,297 B1 * | 10/2012 | Wang | C23C 16/40 257/E21.159 |
| 2008/0128013 A1 * | 6/2008 | Lopatin | C25D 5/022 136/244 |
| 2009/0077805 A1 * | 3/2009 | Bachrach | B26F 3/002 29/890.033 |
| 2011/0168250 A1 * | 7/2011 | Lin | H01L 31/02168 136/256 |
| 2012/0012151 A1 * | 1/2012 | Jayaraman | H01L 31/022425 136/244 |
| 2012/0187391 A1 * | 7/2012 | Kato | C07D 209/86 257/40 |
| 2014/0083493 A1 * | 3/2014 | Zhu | H01L 31/022441 136/256 |
| 2014/0175362 A1 * | 6/2014 | Tendulkar | H01L 45/1253 257/4 |

FOREIGN PATENT DOCUMENTS

| | | | | |
|---|---|---|---|---|
| JP | H05152583 A | 6/1993 | | |
| JP | H0832093 A | 2/1996 | | |
| WO | WO 2013020867 A1 * | 2/2013 | ....... | H01L 21/76898 |

* cited by examiner

10,665,687 B2

METHOD FOR PROCESSING A SEMICONDUCTOR DEVICE AND SEMICONDUCTOR DEVICE

RELATED APPLICATION(S)

This application is a divisional of U.S. patent application Ser. No. 14/284,460, entitled "METHOD FOR PROCESSING A SEMICONDUCTOR DEVICE AND SEMICONDUCTOR DEVICE", filed May 22, 2014, the content of which is incorporated herein by reference in its entirety.

TECHNICAL FIELD

Various embodiments relate to a method for processing a semiconductor device and a semiconductor device.

BACKGROUND

At an interface between a semiconductor and a metallization, a so-called Schottky contact or Schottky barrier may form. Schottky contacts may cause significantly increased leakage currents as a Schottky contact may inject free charge carriers under certain operating conditions. By use of a metallization that has a low Schottky barrier, the aforementioned effect may be avoided or reduced. However, the number of suitable materials for the metallization may be limited. It may be desirable to provide a semiconductor-metallization interface that avoids or substantially reduces the aforementioned effect while at the same time increases flexibility in terms of materials that may be used as metallization.

SUMMARY

In accordance with various embodiments, a method for processing a semiconductor device may include: depositing a first metallization material over a semiconductor body; performing a heating process so as to form at least one region in the semiconductor body including a eutectic of the first metallization material and material of the semiconductor body; and depositing a second metallization material over the semiconductor body so as to contact the semiconductor body via the at least one region in the semiconductor body.

In accordance with various embodiments, a method for processing a semiconductor device may include: depositing a first metallization material over a semiconductor body; performing a heating process so as to form at least one spike-shaped region in the semiconductor body from the first metallization material and material of the semiconductor body; and depositing a second metallization material over the semiconductor body so as to contact the semiconductor body via the at least one spike-shaped region in the semiconductor body.

In accordance with various embodiments, a semiconductor device may include: a semiconductor body; at least one region in the semiconductor body including a eutectic of a first metallization material and material of the semiconductor body; and a second metallization material disposed over the semiconductor body and in contact with the at least one region in the semiconductor body.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
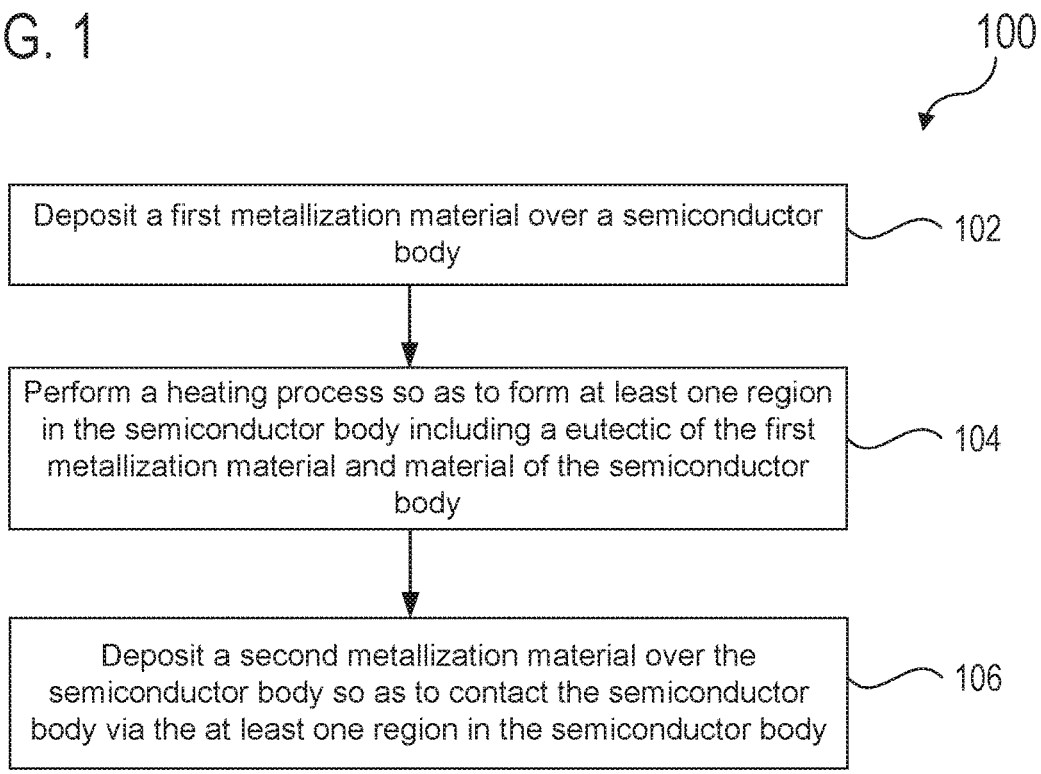
FIG. 1 shows a method for processing a semiconductor device in accordance with various embodiments.

The following detailed description refers to the accompanying drawings that show, by way of illustration, specific details and embodiments in which the invention may be practised. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The word "exemplary" is used herein to mean "serving as an example, instance, or illustration". Any embodiment or design described herein as "exemplary" is not necessarily to be construed as preferred or advantageous over other embodiments or designs.

The terms "at least one" and "one or more" may be understood to include any integer number greater than or equal to one, i.e. one, two, three, four, . . . , etc.

The term "a plurality" may be understood to include any integer number greater than or equal to two, i.e. two, three, four, five, . . . , etc.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The terms "coupling" or "connection" may be understood to include both the case of a direct "coupling" or "connection" and the case of an indirect "coupling" or "connection".

In one or more embodiments, the term "Schottky contact" as used herein may include or may refer to a metal-semiconductor contact or junction (e.g., a contact or junction between a metal and a doped semiconductor) that exhibits a current rectifying behavior.

In one or more embodiments, the term "Schottky barrier" as used herein may include or may refer to a potential energy barrier for charge carriers, e.g. electrons, formed at a Schottky contact.

In one or more embodiments, the term "Ohmic contact" as used herein may include or may refer to a non-rectifying junction, e.g. an electrical junction that has a linear, or at least substantially linear, current-voltage (I-V) curve as with Ohm's law. By contrast, a junction or contact that does not demonstrate a linear I-V curve may be called non-ohmic. A Schottky barrier may be an example of a non-ohmic contact. In one or more embodiments, the term "Ohmic contact" may include or may refer to a metal-semiconductor junction that conducts current in both directions without rectification, or with substantially no rectification, for example due to its Schottky barrier being too low.

In one or more embodiments, the term "eutectic" or "eutectic system" as used herein may include or may refer to a mixture of chemical compounds or elements that have a single chemical composition that solidifies at a lower temperature than any other composition made up of the same ingredients. This composition may be referred to as the eutectic composition and the temperature at which it solidifies may be referred to as the eutectic temperature.

It has turned out that significantly increased leakage currents may occur by means of undesired Schottky contacts between semiconductor layers and metallization layers, since under certain operating conditions a Schottky contact may inject free charge carriers, which may be undesirable. By use of a metallization having a low or negligible Schottky barrier (such as, e.g., aluminum) the aforementioned problem may generally be avoided. However, the choice of suitable materials may be severely limited in this way.

The use of metals with very good heat conductivity and high heat capacity may generally be desirable for better heat dissipation or also for provision of an increased heat capacity. A typical metal that may be suitable in this context may, for example, be copper, with barrier layers such as, e.g., TiW, TiN, TiWN, Ru or TaN, or combinations thereof, generally being inserted between the semiconductor layer and the copper metallization in addition. Such barrier layers, in particular, may lead to Schottky contacts for both n doped and p doped semiconductor layers (e.g. silicon layers) if a sufficiently high doping of the adjacent semiconductor layers is not provided. It may also be helpful to use metals that melt only at relatively high temperatures in order to enhance robustness of the semiconductor devices since due to the relatively high melting point a local alloying of the metallization with the semiconductor layer at local temperature increases (caused, e.g., by current filamentations during switch-off, short-circuiting or cosmic radiation events) may be avoided.

FIG. 1 shows a method 100 for processing a semiconductor device in accordance with various embodiments.

Method 100 may include: depositing a first metallization material over a semiconductor body (in 102); performing a heating process so as to form at least one region in the semiconductor body including a eutectic of the first metallization material and material of the semiconductor body (in 104); and depositing a second metallization material over the semiconductor body so as to contact the semiconductor body via the at least one region in the semiconductor body (in 106).

In one or more embodiments, the semiconductor body may include at least one semiconductor layer.

In one or more embodiments, the semiconductor body may include a layer stack including a plurality of semiconductor layers, e.g. at least two semiconductor layers of different doping types and/or concentrations.

In one or more embodiments, performing a heating process so as to form at least one region in the semiconductor body may include: performing the heating process so as to form at least one spike-shaped region in the semiconductor body including the eutectic of the first metallization material and material of the semiconductor body. In other words, the at least one region formed in the semiconductor body may have a spike shape or spike-like shape.

In one or more embodiments, performing a heating process so as to form at least one region in the semiconductor body may include: performing the heating process so as to form a plurality of spike-shaped regions in the semiconductor body including the eutectic of the first metallization material and material of the semiconductor body.

In one or more embodiments, the at least one region (e.g. spike-shaped region) may extend from a surface of the semiconductor body into the semiconductor body. In one or more embodiments, the surface may be a surface facing the deposited first metallization material.

In one or more embodiments, the at least one region (e.g. spike-shaped region) may extend to a depth of about 50 nm to about 1 µm, measured from the surface of the semiconductor body, e.g. to a depth of about 100 nm to about 1 µm in one or more embodiments, e.g. to a depth of about 100 nm to about 600 nm in one or more embodiments, e.g. to a depth of about 200 nm to about 600 nm in one or more embodiments.

In one or more embodiments, the at least one region (e.g. spike-shaped region) may have a first diameter proximate the surface of the semiconductor body and a second diameter distant from the surface of the semiconductor body, wherein the first diameter may be larger than the second diameter.

In one or more embodiments, a diameter of the at least one region (e.g. spike-shaped region) at or proximate the surface of the semiconductor body may be in the range from about 200 nm to about 2 µm, e.g. in the range from about 400 nm to about 1.5 µm, e.g. in the range from about 600 nm to about 2 µm.

In one or more embodiments, a distance between at least two neighboring spike-shaped regions of the plurality of spike-shaped regions may be in the range from about 1 µm to about 100 µm, e.g. in the range from about 3 µm to about 15 µm.

In one or more embodiments, a density of the plurality of spike-shaped regions may be in the range from about 5 spikes per 100 µm$^2$ to about 100 spikes per 100 µm$^2$, e.g. in the range from about 10 spikes per 100 µm$^2$ to about 50 spikes per 100 µm$^2$, e.g. in the range from about 20 spikes per 100 µm$^2$ to about 100 spikes per 100 µm$^2$, e.g. in the range from about 5 spikes per 100 µm$^2$ to about 20 µm$^2$. In one or more embodiments, the term "density" may refer to the number of spike-shaped regions per surface unit area of the semiconductor body.

In one or more embodiments, the method may further include removing residues of the first metallization material from above the semiconductor body after performing the heating process and before depositing the second metallization material.

In one or more embodiments, the first metallization material may include or may be a material that forms a eutectic with the material of the semiconductor body at a temperature of less than or equal to about 600° C.

In one or more embodiments, the first metallization material may have a lower work function than the second metallization material.

In one or more embodiments, the first metallization material may have a work function of less than or equal to about 6 eV, e.g. less than or equal to about 5 eV, for example in the range from about 3 eV to 6 eV, e.g. in the range from about 4 eV to 5 eV, e.g. about 4.4 eV.

In one or more embodiments, the first metallization material may be selected such that a Schottky barrier between the first metallization material and the material of the semiconductor body is lower than a Schottky barrier between the second metallization material and the material of the semiconductor body.

In one or more embodiments, a Schottky barrier between the first metallization material and the material of the semiconductor body (e.g., p doped silicon) may be less than or equal to about 1 eV, for example in the range from about 0.2 eV to about 1 eV.

In one or more embodiments, the at least one region in the semiconductor body including the eutectic may form an ohmic contact to the semiconductor body.

In one or more embodiments, the first metallization material may include or may be at least one material selected from a group of materials, the group consisting of: aluminum, gold-tin, tin, indium.

In one or more embodiments, the second metallization material may include or may be a refractory metal or metal alloy.

In one or more embodiments, the second metallization material may include or may be a barrier layer material.

In one or more embodiments, the second metallization material may include or may be at least one material selected from a group of materials, the group consisting of: titanium-tungsten, titanium-nitride, tantalum-nitride, titanium-tantalum, titanium tungsten nitride, ruthenium.

In one or more embodiments, the second metallization material may include or may be at least one material selected from a group of materials, the group consisting of: copper, aluminum.

In one or more embodiments, performing a heating process so as to form at least one region in the semiconductor body may include heating at a temperature of about 330° C. to about 480° C., e.g. at a temperature of about 350° C. to about 420° C. in one or more embodiments.

In one or more embodiments, performing a heating process so as to form at least one region in the semiconductor body may include heating for a time duration of about 15 min to about 2 hours, e.g. for a time duration of about 30 min to about 1 hour in one or more embodiments.

In one or more embodiments, the method may further include depositing a third metallization material over the second metallization material.

In one or more embodiments, the second metallization material may include or may be at least one material selected from a group of materials, the group consisting of: titanium-tungsten, titanium-nitride, tantalum-nitride, and titanium-tantalum; and the third metallization material may include or may be at least one material selected from a group of materials, the group consisting of: copper, aluminum.

In one or more embodiments, depositing a first metallization material over a semiconductor body may include covering an entire surface of the semiconductor body with the first metallization material.

In one or more embodiments, depositing a first metallization material over a semiconductor body may include forming a patterned layer of the first metallization material over the semiconductor body.

In one or more embodiments, forming a patterned layer of the first metallization material over the semiconductor body may include: covering the semiconductor body with the first metallization material; forming a mask over the first metallization material; patterning the mask so as to expose at least one portion of the first metallization material; removing the exposed at least one portion of the first metallization material.

In one or more embodiments, removing the exposed at least one portion of the first metallization material comprises etching the exposed at least one portion of the first metallization material.

In one or more embodiments, depositing a first metallization material over a semiconductor body may include: forming a layer over the semiconductor body; patterning the layer so as to expose at least one portion of the semiconductor body; depositing the first metallization material over the patterned layer and the exposed at least one portion of the semiconductor body; and removing the patterned layer and a portion of the first metallization material disposed over the patterned layer, wherein a portion of the first metallization material disposed over the at least one portion of the semiconductor body remains.

In one or more embodiments, the layer may include or may be made of a photoresist material.

In one or more embodiments, patterning the layer may include a photolithographic process.

In one or more embodiments, the at least one region (e.g. spike-shaped region) may have an inverse pyramid like shape.

In one or more embodiments, the inverse pyramid like shape may have a base diameter in the range from about 200 nm to about 2 μm, e.g. in the range from about 400 nm to about 1.5 μm in one or more embodiments, e.g. in the range from about 600 nm to about 2 μm in one or more embodiments. In one or more embodiments, the base diameter may correspond to the first diameter at or proximate the surface of the semiconductor body, described herein above.

In one or more embodiments, the semiconductor body, or at least one semiconductor layer of the semiconductor body, may include or may be made of silicon.

In one or more embodiments, the semiconductor body, or at least one semiconductor layer of the semiconductor body, may be doped, e.g. p-doped or n-doped.

In one or more embodiments, the semiconductor body, or at least one semiconductor layer of the semiconductor body which can be e.g. the drift zone of an IGBT or of a diode, may be doped with a dopant concentration of less than or equal to about $5 \times 10^{13}$ cm$^{-3}$, for example in the range from about $3 \times 10^{13}$ cm$^{-3}$ to about $1 \times 10^{14}$ cm$^{-3}$, for example in the range from about $5 \times 10^{13}$ cm$^{-3}$ to about $1 \times 10^{14}$ cm$^{-3}$. In one or more embodiments, the implanted dopants may undergo an outdiffusion, e.g. a shallow or deep outdiffusion.

Method 100 may further be configured in accordance with one or more embodiments described herein.

Figure 2:
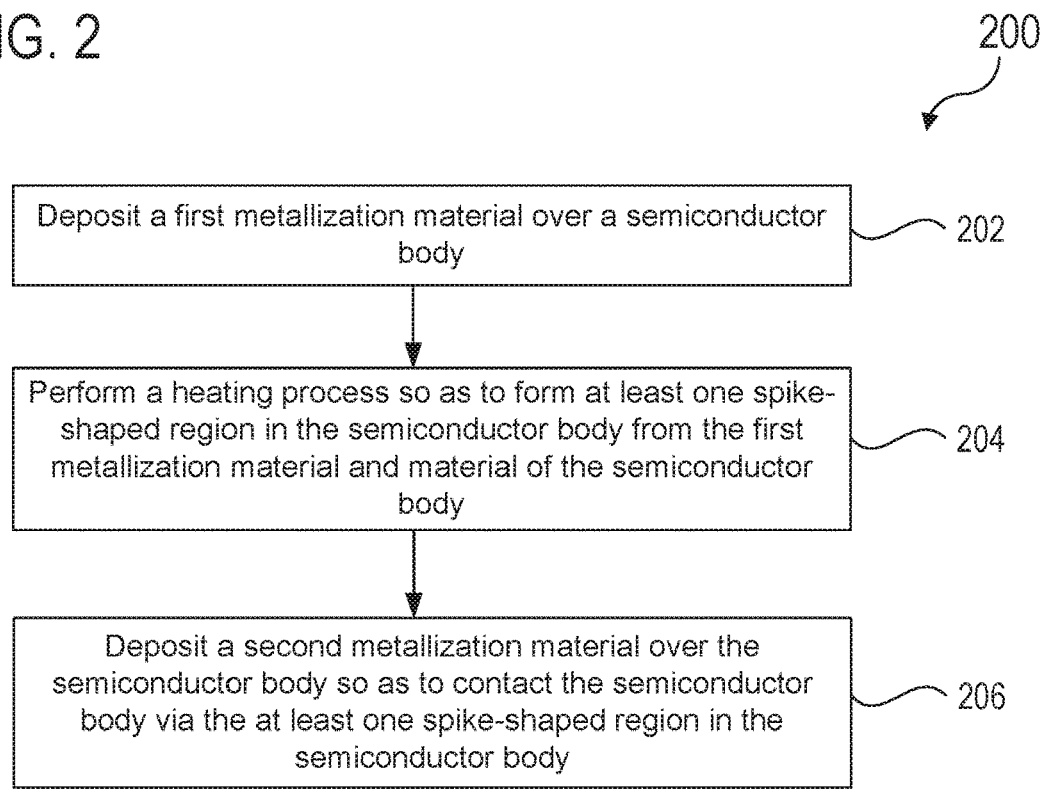
FIG. 2 shows a method for processing a semiconductor device in accordance with various embodiments.

FIG. 2 shows a method 200 for processing a semiconductor device in accordance with various embodiments.

Method 200 may include: depositing a first metallization material over a semiconductor body (in 202); performing a heating process so as to form at least one spike-shaped region in the semiconductor body from the first metallization material and material of the semiconductor body (in 204); and depositing a second metallization material over the semiconductor body so as to contact the semiconductor body via the at least one spike-shaped region in the semiconductor body (in 206).

In one or more embodiments, the first metallization material may include or may be a material that forms a eutectic with the material of the semiconductor body at a temperature of less than or equal to about 600° C.

Method 200 may further be configured in accordance with one or more embodiments described herein.

FIG. 3A to FIG. 3F show various views illustrating a method for processing a semiconductor device in accordance with various embodiments.

Figure 3A:
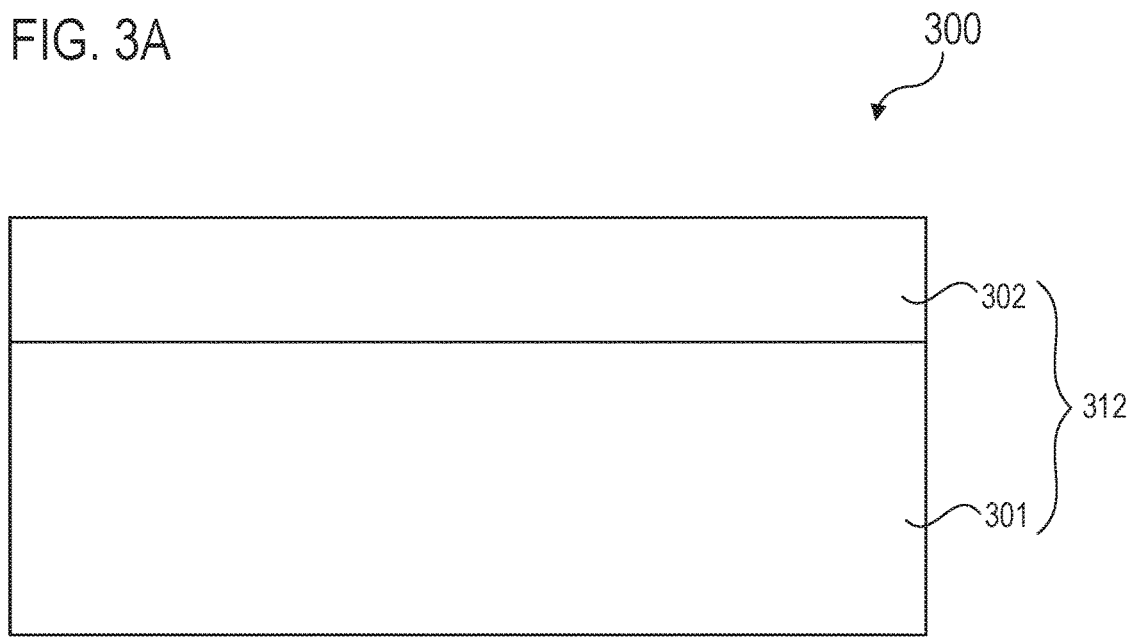
FIG. 3A to FIG. 3F are various views illustrating a method for processing a semiconductor device in accordance with various embodiments.

FIG. 3A shows, in a view 300, that a semiconductor body 312 may be provided, including a first semiconductor layer 301 and a second semiconductor layer 302 disposed over the first semiconductor layer 301. In one or more embodiments, the semiconductor body 312, e.g. the first semiconductor layer 301 and/or the second semiconductor layer 302, may include or may be made of a semiconductor material. In one or more embodiments, the semiconductor material may include or may be silicon, although semiconductor materials, including compound semiconductor materials, may be possible as well in accordance with one or more embodiments.

In one or more embodiments, the first semiconductor layer 301 may be a doped layer, e.g. an n-doped layer or a p-doped layer. In one or more embodiments, the second semiconductor layer 302 may be a doped layer, e.g. a p-doped layer or an n-doped layer. In one or more embodiments, the first semiconductor layer 301 may be an n-doped layer and the second semiconductor layer 302 may be a p-doped layer.

In one or more embodiments, the first semiconductor layer 301 may have been doped with a dopant concentration of less than or equal to about $5 \times 10^{13}$ cm$^{-3}$, for example in the range from about $3 \times 10^{12}$ cm$^{-3}$ to about $1 \times 10^{14}$ cm$^{-3}$, for example in the range from about $5 \times 10^{12}$ cm$^{-3}$ to about $1 \times 10^{14}$ cm$^{-3}$.

In one or more embodiments, the second semiconductor layer 302 may have been doped with a dopant dose of less than or equal to about $5 \times 10^{13}$ cm$^{-2}$, for example in the range from about $5 \times 10^{12}$ cm$^{-2}$ to about $5 \times 10^{13}$ cm$^{-2}$.

In one or more embodiments, the semiconductor body 312 may include the first semiconductor layer 301 but not the second semiconductor layer 302, or vice versa. In one or more embodiments, the semiconductor body 312 may include at least one additional layer, other than the first semiconductor layer 301 and/or the second semiconductor layer 302. The at least one additional layer may include or may be at least one semiconductor layer, and/or at least one insulating layer, and/or at least one conductive layer.

In one or more embodiments, the semiconductor body 312 may include at least one electrical or electronic element, e.g. at least one circuit element, such as, e.g., a resistor, diode, a transistor, a thyristor, or the like. In one or more embodiments, the semiconductor body 312 may include at least one electrical interconnect, electrical contact, or via, or the like.

Figure 3B:
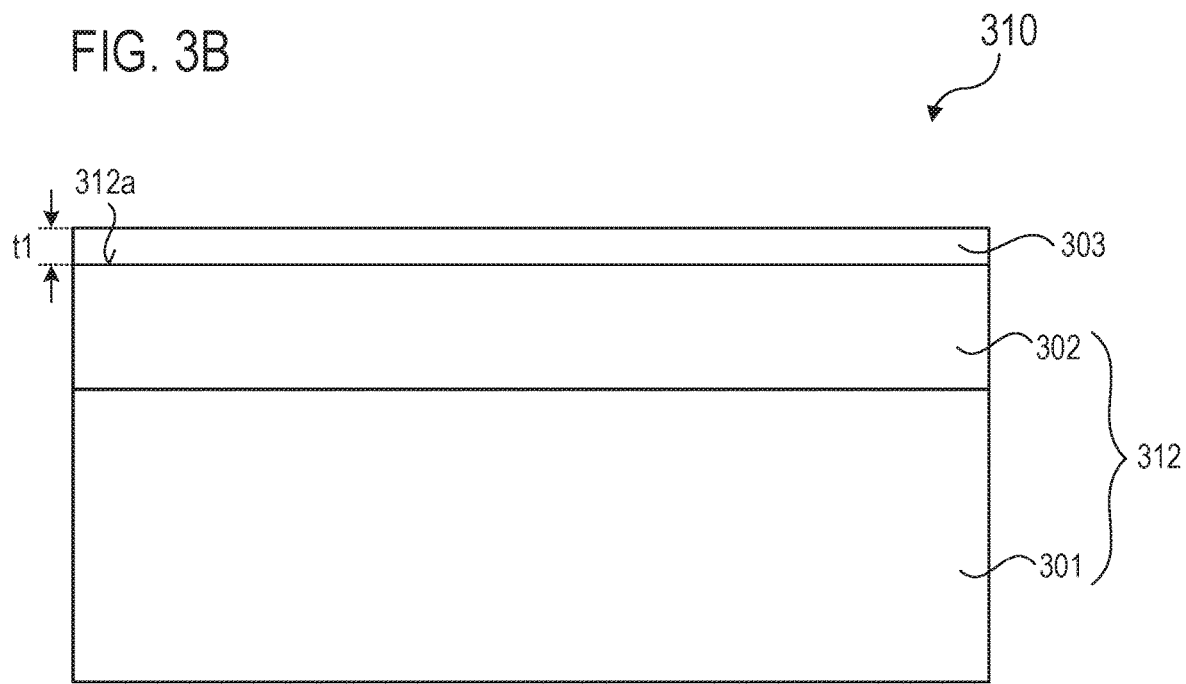

FIG. 3B shows, in a view 310, that a first metallization material 303 may be deposited over the semiconductor body 312, e.g. over the second semiconductor layer 302 as shown.

The first metallization material 303 may be deposited by any suitable deposition process, which may be known as such in the art, e.g. a vapor deposition process, e.g. physical vapor deposition (PVD) or chemical vapor deposition (CVD), e.g. sputter deposition, a plating process, or the like.

In one or more embodiments, the first metallization material 303 may be deposited with a thickness (referred to as "t1" in FIG. 3B) of about 100 nm to about 5 μm, although other thicknesses may be possible as well.

In one or more embodiments, the first metallization material 303 may include or may be a material that forms a eutectic with the material of the semiconductor body 312, e.g. of the second semiconductor layer 302.

In one or more embodiments, the first metallization material 303 may include or may be a material that forms a eutectic with the material of the semiconductor body 312, e.g. of the second semiconductor layer 302, at a temperature of less than or equal to about 600° C.

In one or more embodiments, the first metallization material 303 may have a lower work function than a second metallization material to be deposited later, as will be described herein below.

In one or more embodiments, the first metallization material 303 may have a work function of less than or equal to about 6 eV, e.g. less than or equal to about 5 eV, for example in the range from about 3 eV to 6 eV, e.g. in the range from about 4 eV to 5 eV, e.g. about 4.4 eV.

In one or more embodiments, the first metallization material 303 may be selected such that a Schottky barrier between the first metallization material 303 and the material of the semiconductor body 312, e.g. of the second semiconductor layer 302, is lower than a Schottky barrier between the second metallization material and the material of the semiconductor body 312, e.g. of the second semiconductor layer 302.

In one or more embodiments, a Schottky barrier between the first metallization material 303 and the material of the semiconductor body 312, e.g. of the second semiconductor layer 302, may be less than or equal to about 1 eV, for example in the range from about 0.2 eV to about 1 eV.

In one or more embodiments, the first metallization material 303 may include or may be at least one material selected from a group of materials, the group consisting of: aluminum, gold-tin, tin, indium.

In one or more embodiments, depositing the first metallization material 303 over the semiconductor body 312, e.g. over the second semiconductor layer 302, may include depositing the first metallization material 303 over an entire surface (e.g., an entire upper surface) 312a of the semiconductor body 312, e.g. of the second semiconductor layer 302. In other words, in one or more embodiments, the deposited first metallization material 303 may cover the entire surface (e.g. entire upper surface) 312a of the semiconductor body 312, e.g. of the second semiconductor layer 302.

In one or more embodiments, depositing the first metallization material 303 over the semiconductor body 312, e.g. over the second semiconductor layer 302, may include depositing the first metallization material 303 over only a portion of the surface (e.g., the upper surface) 312a of the semiconductor body 312, e.g. of the second semiconductor layer 302. In other words, in one or more embodiments, the deposited first metallization material 303 may cover only a portion of the surface (e.g. upper surface) 312a of the semiconductor body 312, e.g. of the second semiconductor layer 302.

Figure 3C:
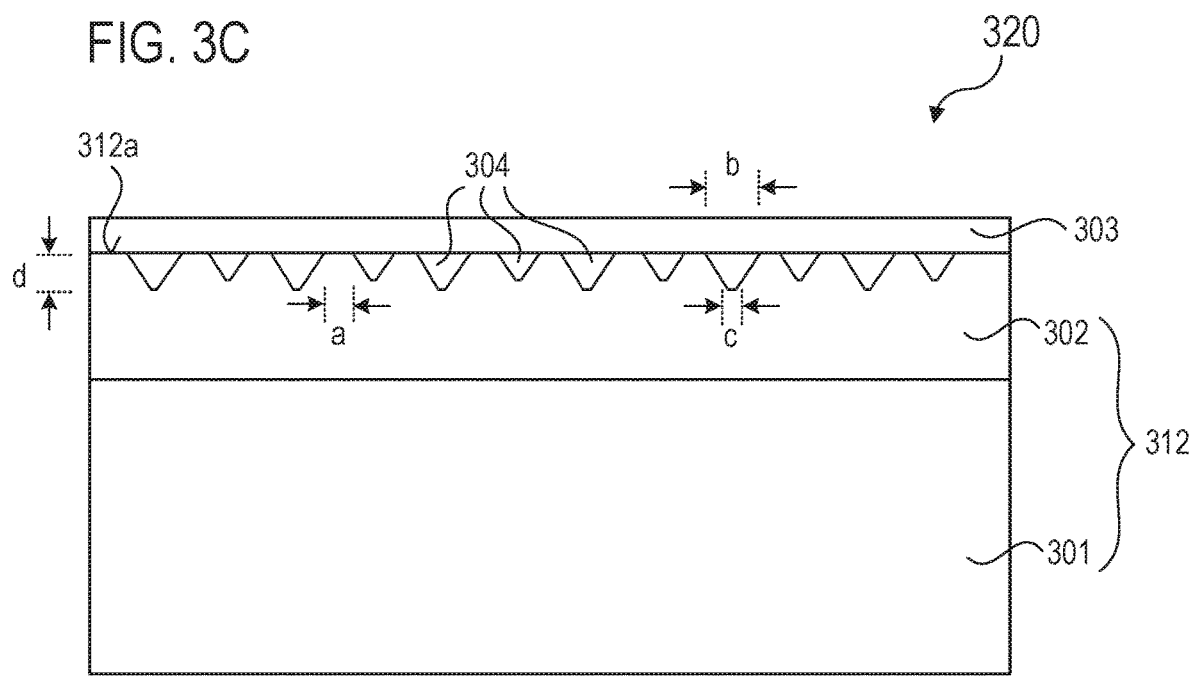

FIG. 3C shows, in a view 320, that a heating process may be performed. By means of the heating process, at least one region 304 (e.g., a plurality of regions 304, as shown) may be formed in the semiconductor body 312, e.g. in in the second semiconductor layer 302 as shown. Each of the regions 304 may include a eutectic of the first metallization material 303 and material of the semiconductor body 312, e.g. of the second semiconductor layer 302 as shown. For example, in case the first metallization material 303 includes or is aluminum and the material of the semiconductor body 312, e.g. of the second semiconductor layer 302, is silicon, each region 304 may contain or may be made of an aluminum silicon eutectic, in other words, a eutectic system based on, or made of, aluminum and silicon.

Illustratively, the heating process may cause at least a portion of the first metallization material 303 and material of the semiconductor body 312 to form a eutectic in the semiconductor body 312, for example in one or more regions proximate the surface 312a of the semiconductor body 312.

In one or more embodiments, the heating process may include heating to a temperature of about 330° C. to about 480° C., e.g. to a temperature of about 350° C. to about 420° C. in one or more embodiments.

In one or more embodiments, the heating process may include heating for a time duration of about 15 min to about 2 hours, e.g. for a time duration of about 30 min to about 1 hour in one or more embodiments.

In one or more embodiments, the at least one region 304 may have a spike-like shape, as shown.

In one or more embodiments, the at least one region (e.g. spike-shaped region) 304 may extend from the surface (e.g. upper surface) 312a of the semiconductor body 312, e.g. second semiconductor layer 302, into the semiconductor body 312, e.g. second semiconductor layer 302.

In one or more embodiments, the at least one region (e.g. spike-shaped region) 304 may extend to a depth (referred to as "d" in FIG. 3C) of about 50 nm to about 1 μm, measured from the surface 312a of the semiconductor body 312 (e.g. the second semiconductor layer), e.g. to a depth of about 100 nm to about 1 μm in one or more embodiments, e.g. to a depth of about 100 nm to about 600 nm in one or more embodiments, e.g. to a depth of about 200 nm to about 600 nm in one or more embodiments.

In one or more embodiments, the at least one region (e.g. spike-shaped region) 304 may have a first diameter (referred to as "b" in FIG. 3C) at or proximate the surface (e.g. upper surface) 312a of the semiconductor body 312, e.g. second semiconductor layer 302, and a second diameter (referred to as "c" in FIG. 3C) distant from the surface 312a of the semiconductor body 312, e.g. second semiconductor layer 302, wherein the first diameter may be larger than the second diameter.

In one or more embodiments, the first diameter of the at least one region (e.g. spike-shaped region) 304 at or proximate the surface 312a of the semiconductor body 312, e.g. second semiconductor layer 302, may be in the range from about 200 nm to about 2 μm, e.g. in the range from about 400 nm to about 1.5 μm, e.g. in the range from about 600 nm to about 2 μm in one or more embodiments.

In one or more embodiments, the at least one region (e.g. spike-shaped region) 304 may have an inverse pyramid like shape.

In one or more embodiments, the inverse pyramid like shape may have a base diameter in the range from about 200 nm to about 2 μm, e.g. in the range from about 400 nm to about 1.5 μm in one or more embodiments, e.g. in the range from about 600 nm to about 2 μm in one or more embodiments. In one or more embodiments, the base diameter may correspond to the first diameter (e.g., diameter "b" in FIG. 3C) described herein above.

In one or more embodiments, a distance (referred to as "a" in FIG. 3C) between at least two neighboring regions (e.g. spike-shaped regions) 304 of the plurality of regions (e.g. spike-shaped regions) 304 may be in the range from about 1 μm to about 100 μm, e.g. in the range from about 3 μm to about 15 μm.

In one or more embodiments, a density of the plurality of regions (e.g. spike-shaped regions) 304 may be in the range from about 5 spikes per 100 $\mu m^2$ to about 100 spikes per 100 $\mu m^2$, e.g. in the range from about 10 spikes per 100 $\mu m^2$ to about 50 spikes per 100 $\mu m^2$, e.g. in the range from about 20 spikes per 100 $\mu m^2$ to about 100 spikes per 100 $\mu m^2$.

In one or more embodiments, the at least one region 304 in the semiconductor body 312, e.g. in the second semiconductor layer 302, including the eutectic may form an ohmic contact to the semiconductor body 312, e.g. to the second semiconductor layer 302.

In one or more embodiments, a portion (or residues) of the metallization material 303 may remain over the surface 312a of the semiconductor body 312, e.g. of the second semiconductor layer 302, after the heating process, as shown in FIG. 3C. This portion may be removed before depositing the second metallization material, as will be described herein below.

Figure 3D:
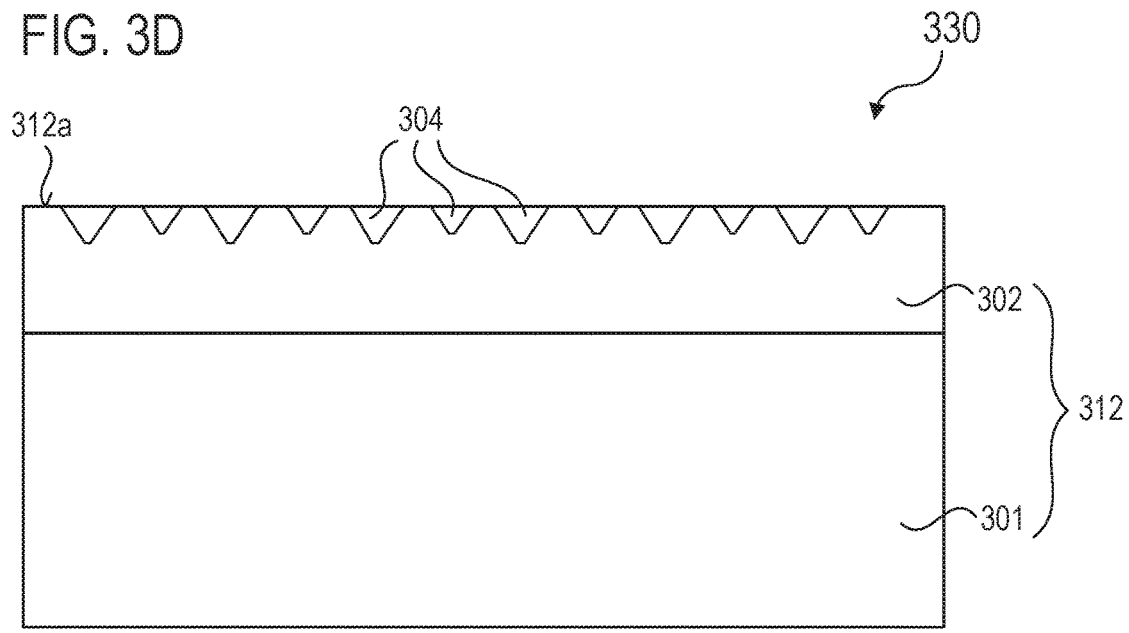

FIG. 3D shows, in a view 330, that after the heating process, residues of the first metallization material 303 may be removed from above the semiconductor body 312, e.g. from above the second semiconductor layer 302 as shown. The residues may be removed before applying the second metallization material. The residues may be removed by any suitable process such as, e.g., a cleaning process, an etching process, a chemical mechanical polishing process, or the like, or combinations thereof. Removing the first metallization material 303 from the surface 312a of the semiconductor body 312, e.g. of the second semiconductor layer 302, may uncover the surface 312a of the semiconductor body 312, e.g. of the second semiconductor layer 302, and the at least one region 304 or plurality of regions 304 that may remain in the semiconductor body 312, e.g. in the second semiconductor layer 302.

Figure 3E:
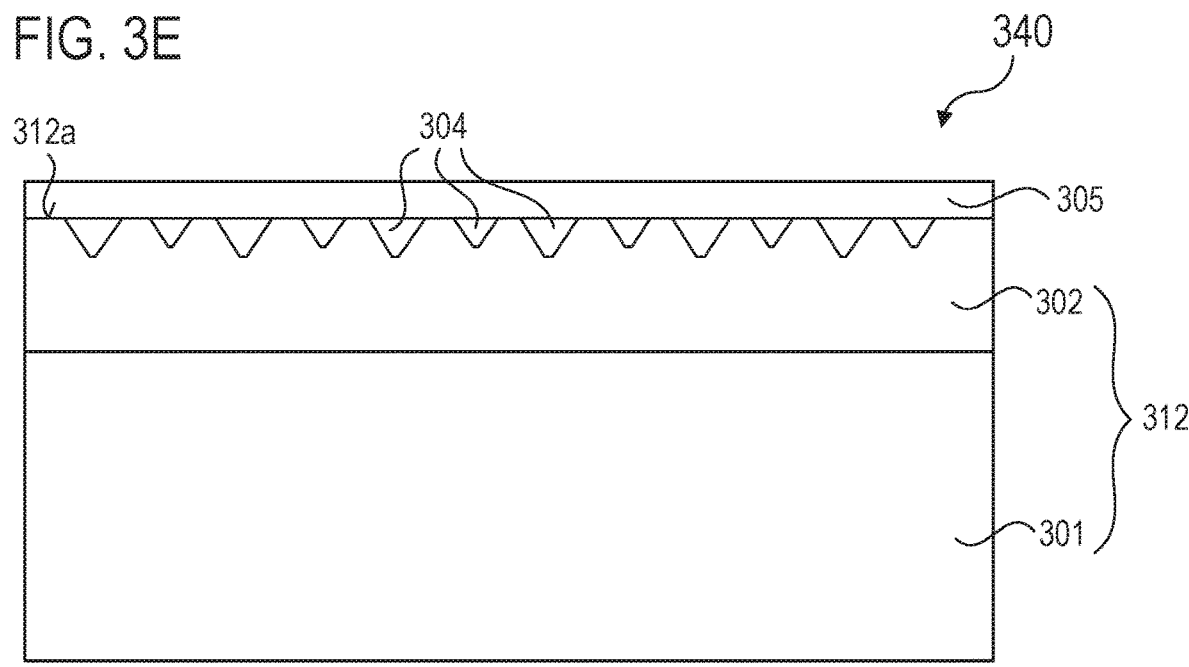

FIG. 3E shows, in a view 340, that a second metallization material 305 may be deposited over the semiconductor body 312, e.g. over the second semiconductor layer 302 as shown.

The second metallization material 305 may be deposited by any suitable deposition process, which may be known as such in the art, e.g. a vapor deposition process, e.g. physical vapor deposition (PVD) or chemical vapor deposition (CVD), e.g. sputter deposition, a plating process, or the like.

The second metallization material 305 may include or may be an arbitrary metallization material, e.g. an arbitrary metal and/or metal alloy.

In one or more embodiments, the second metallization material 305 may have a higher work function than the first metallization material 305.

In one or more embodiments, the second metallization material 305 may include or may be a refractory metal or metal alloy.

In one or more embodiments, the second metallization material 305 may include or may be a barrier layer material.

In one or more embodiments, the second metallization material 305 may include or may be at least one material selected from a group of materials, the group consisting of:

titanium-tungsten, titanium-nitride, tantalum-nitride, titanium-tantalum, titanium tungsten nitride, ruthenium.

In one or more embodiments, the second metallization material 305 may include or may be at least one material selected from a group of materials, the group consisting of: copper, aluminum.

After deposition, the second metallization material 305 may be in contact (e.g. direct physical contact) with at least some (e.g., all) of the plurality of regions 304. Thus, the second metallization material 305 may contact the semiconductor body 312, e.g. the second semiconductor layer 302, via at least some (e.g., all of) the plurality of regions 304. The region or regions 304 may form an ohmic contact or contacts between the second metallization material 305 and the semiconductor body 312, e.g. the second semiconductor layer 302.

In one or more embodiments, a portion or portions of the second metallization material 305 may be in contact (e.g. direct physical contact) with the semiconductor body 312, e.g. the second semiconductor layer 302, as shown. This portion or these portions of the second metallization material 305 may form a Schottky contact or Schottky contacts with the semiconductor body 312, e.g. the second semiconductor layer 302. However, potential adverse effects of the Schottky contact or Schottky contacts (e.g. occurrence of leakage currents) may be obviated, or at least substantially reduced, by the parallel ohmic contact or contacts provided by the region or regions 304 in the semiconductor body 312, e.g. in the second semiconductor layer 302.

In one or more embodiments, the second metallization material 305 may be deposited with have a thickness in the range from about 50 nm to about 5 µm, for example in the range from about 100 nm to about 1 µm in accordance with one or more embodiments, however other values of the thickness may be possible in accordance with other embodiments.

Figure 3F:
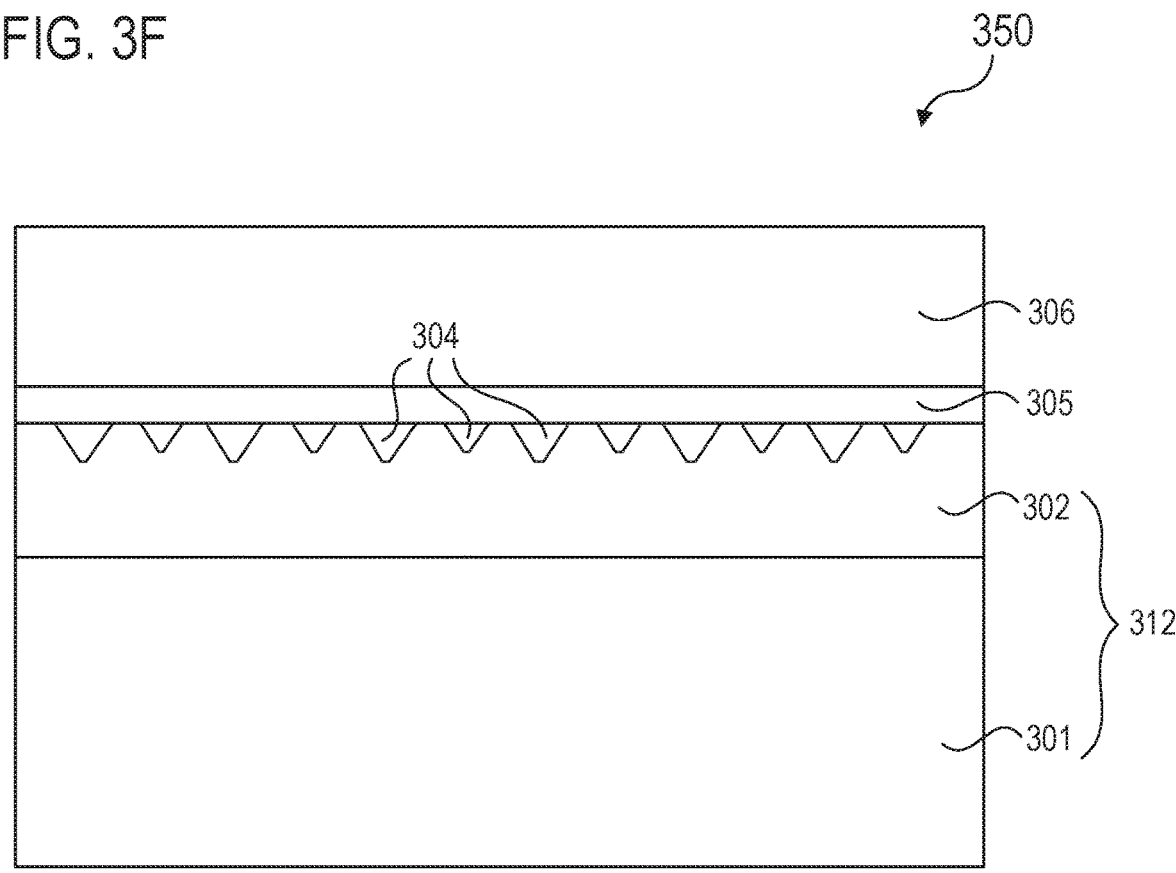

FIG. 3F shows, in a view 350, that in accordance with some embodiments, a third metallization material 306 may be deposited over the second metallization material 305. For example, in one or more embodiments, the second metallization material 305 and the third metallization material 306 may represent, respectively, a diffusion barrier layer and a metallization layer.

In one or more embodiments, the third metallization material 306 may be deposited with a thickness in the range from about 500 nm to about 20 µm, however other values of the thickness may be possible in accordance with other embodiments.

In one or more embodiments, the metallization layer may be thicker than the diffusion barrier layer. For example, in one or more embodiments, the diffusion barrier layer formed by the second metallization material 305 may have a thickness in the range from about 50 nm to about 1 µm while the metallization layer formed by the third metallization material 306 may have a thickness in the range from about 500 nm to about 20 µm, although other thicknesses may be possible as well.

In one or more embodiments, the second metallization material 305 may include or may be at least one material selected from a group of materials, the group consisting of: titanium-tungsten, titanium-nitride, tantalum-nitride, and titanium-tantalum; and the third metallization material 306 may include or may be at least one material selected from a group of materials, the group consisting of: copper, aluminum.

FIG. 4A to FIG. 4G show various views illustrating a method for processing a semiconductor device in accordance with various embodiments.

Reference numerals that are the same as used in FIG. 3A to FIG. 3F may denote the same or similar elements and will not be described in detail again here. Reference is made to the description above.

Figure 4A:
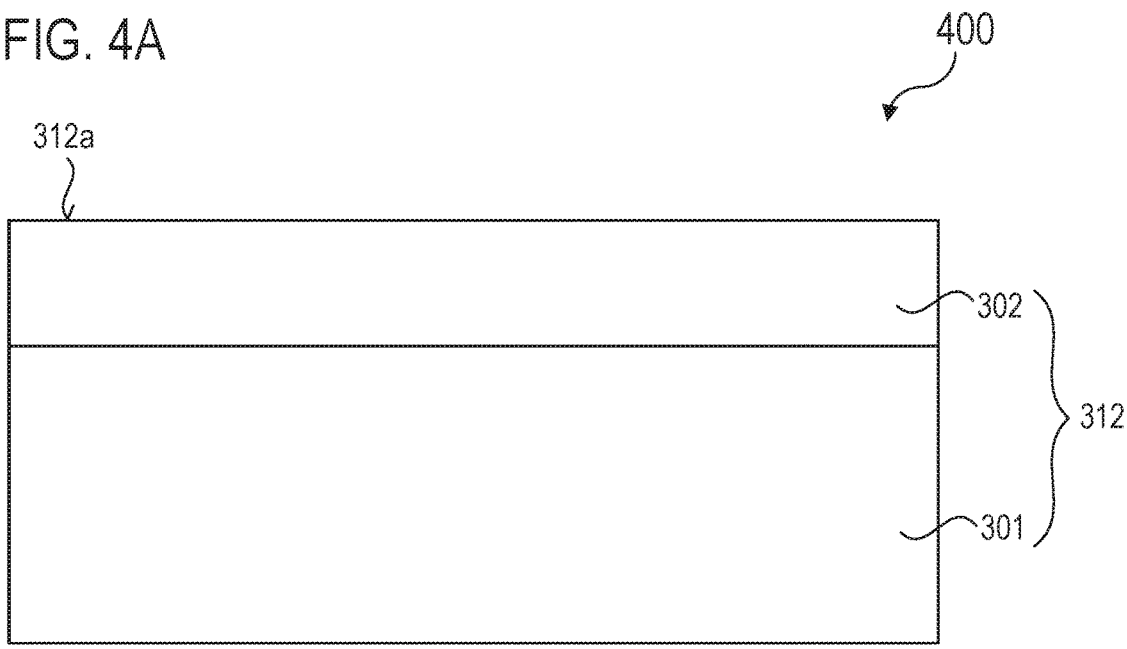
FIG. 4A to FIG. 4H are various views illustrating a method for processing a semiconductor device in accordance with various embodiments.

FIG. 4A shows, in a view 400, that a semiconductor body 312 may be provided. The semiconductor body 312 may be configured in the same or a similar manner as the semiconductor body 312 shown in FIG. 3A, e.g. including a first semiconductor layer 301 and a second semiconductor layer 302 disposed over the first semiconductor layer 301, as shown.

Figure 4B:
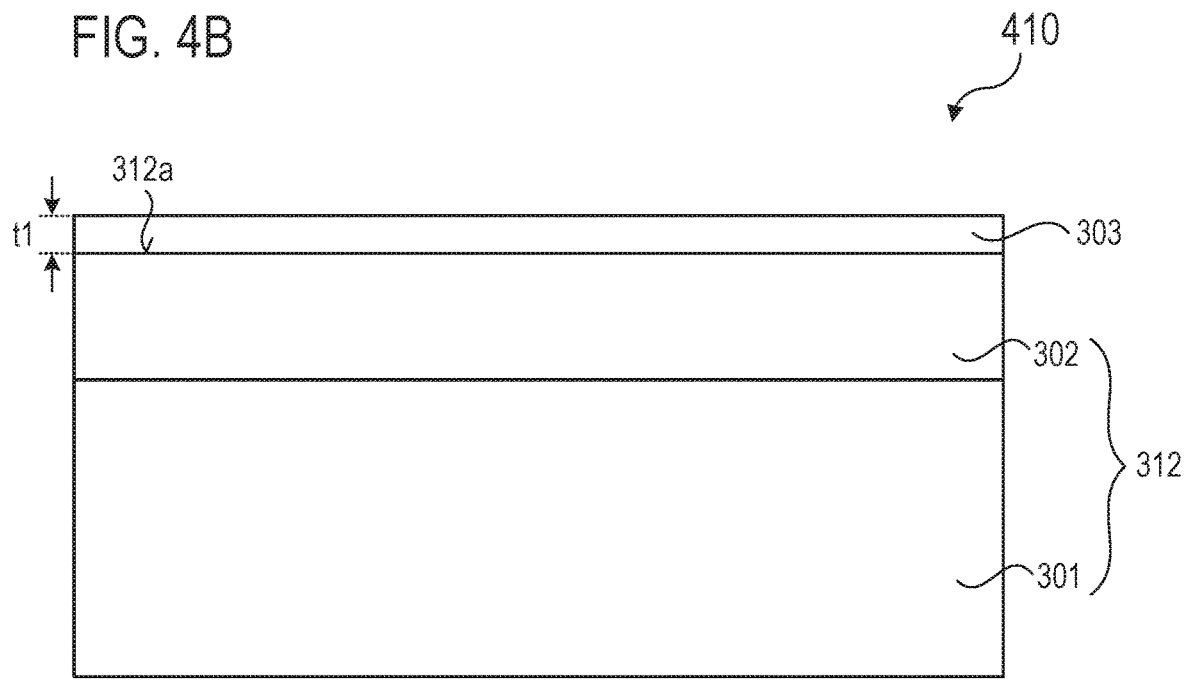

FIG. 4B shows, in a view 410, that a first metallization material 303 may be deposited over the second semiconductor body 302, e.g. over the second semiconductor layer 302, e.g. in a similar manner as described herein above in connection with FIG. 3B. The first metallization material 303 may, for example, be configured in accordance with one or more embodiments described herein above in connection with FIG. 3B.

Figure 4C:
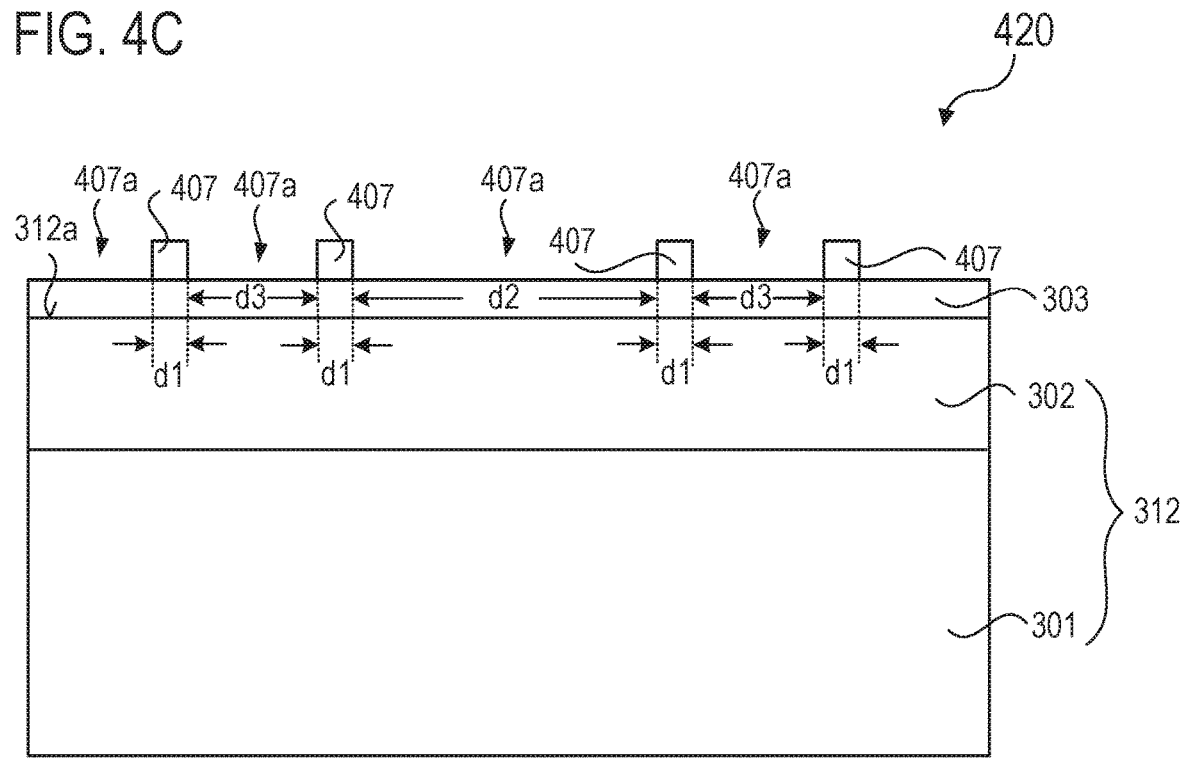

FIG. 4C shows, in a view 420, that a mask 407 may be formed over the first metallization material 303, for example by means of depositing a layer, e.g. a photoresist layer, and patterning the layer, e.g. by means of photolithography. The mask 407 may include at least one opening 407a, e.g. a plurality of openings 407a, that expose(s) one or more portions of the first metallization material 303 and covers one or more portions of the first metallization material 303. The openings 407a may all have the same, or at least substantially the same, diameter, or they may have different diameters, e.g. diameter d2 and diameter d3 shown in FIG. 4C. The diameter, e.g. d2 or d3, of an opening 407a may correspond to a distance between two portions of the first metallization material 303 that are covered by the mask 407.

The portions of the first metallization material 303 that are covered by the mask 407 may all have the same, or at least substantially the same, diameter, e.g. diameter d1 shown in FIG. 4C, or they may have different diameters. The diameter d1 of a portion of the first metallization material 303 that is covered by the mask 407 may correspond to a distance between two neighboring openings 407a of the mask 407.

In one or more embodiments, the diameter of the covered portion(s) of the first semiconductor material 303, e.g. diameter d1, may be in the range from about 200 nm to about 7 µm, e.g. in the range from about 200 µm to about 5 µm, e.g. in the range from about 500 nm to about 2 µm, however other values of the diameter may be possible in accordance with other embodiments.

In one or more embodiments, the mask 407 may form a periodic structure having a plurality of openings 407a spaced at regular intervals.

The mask 407, e.g. the size, shape, and/or intervals between the openings 407a, may be predetermined to obtain a desired design (e.g., desired size and/or distance) of spike-shaped regions that may be formed later from the first metallization material 303 and material of the semiconductor body 312, as will be described herein below.

Figure 4D:
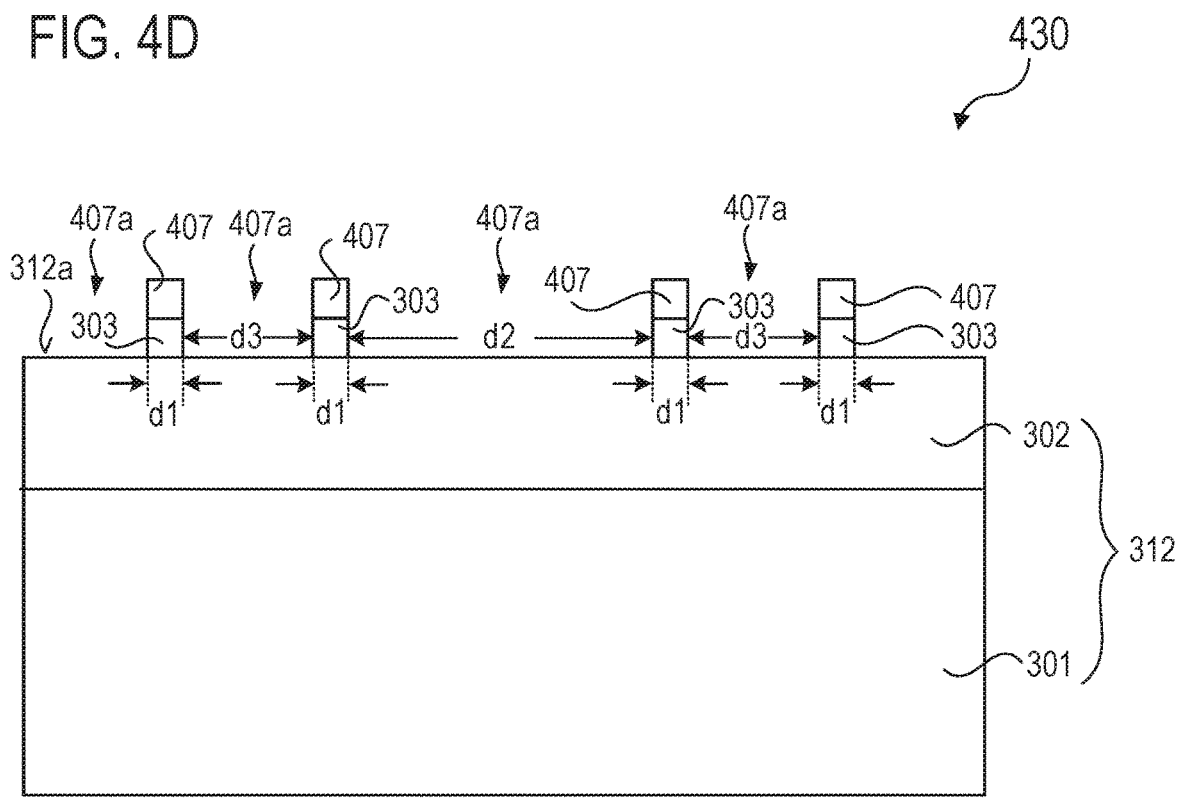

FIG. 4D shows, in a view 430, that the first metallization material 303 may be patterned using the mask 407, for example by means of wet chemical etching or dry etching. Illustratively, the pattern of the mask 407 may be transferred to the first metallization material 303. Thus, remaining portions of the first metallization material 303 may have a diameter or diameters corresponding to the diameter or diameters of the covered portions, e.g. diameter d1, and may have a distance or distances corresponding to the diameter or diameters of the openings 407a, e.g. diameters d2 and d3, as shown.

Figure 4E:
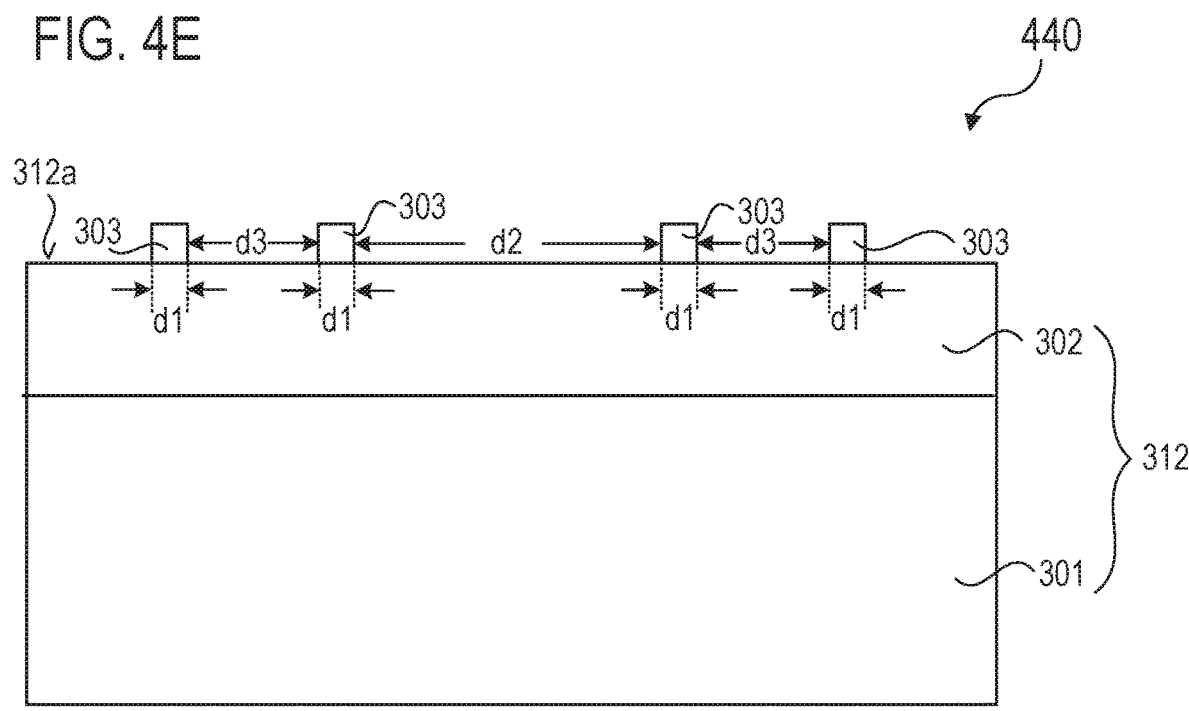

FIG. 4E shows, in a view 440, that the mask 407 may be removed after the first metallization material 303 has been patterned, leaving the patterned first metallization material 303 over the surface 312a of the semiconductor body 312.

Figure 4F:
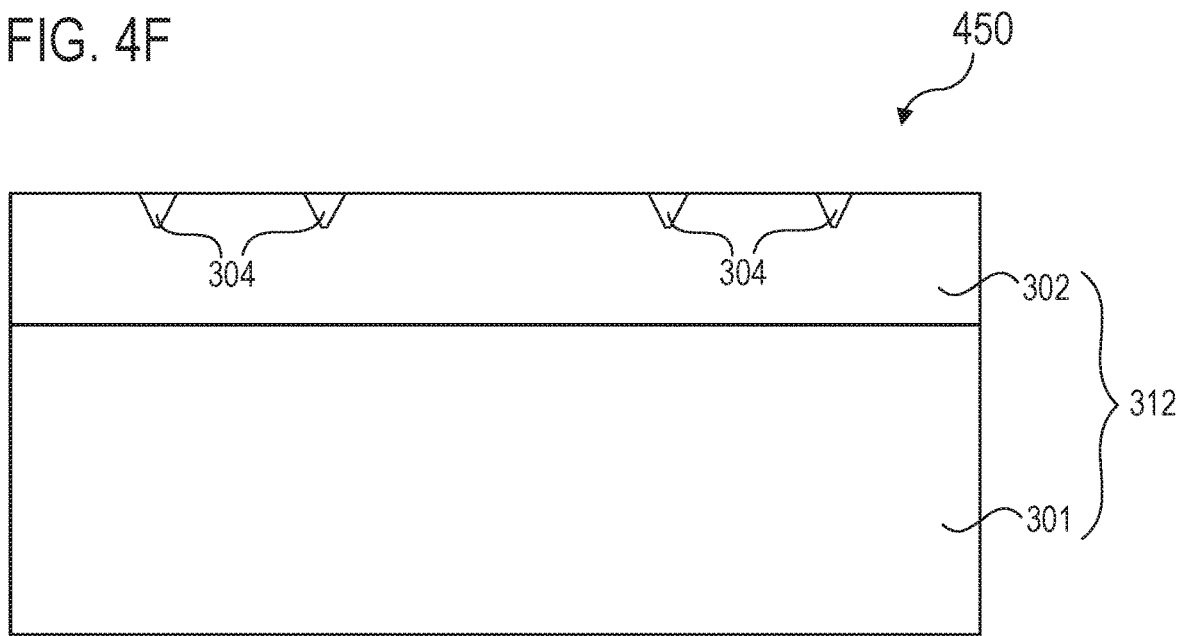

FIG. 4F shows, in a view 450, that a heating process may be performed so as to form at least one region 304 (e.g., a plurality of regions 304, as shown) in the semiconductor body 312, e.g. in in the second semiconductor layer 302, each region 304 including a eutectic of the first metallization material 303 and material of the semiconductor body 312, e.g. of the second semiconductor layer 302, in a similar manner as described herein above in connection with FIG. 3C. As shown in FIG. 4F, locations, sizes, and/or distances between the (e.g., spike-shaped) regions 304 may be determined or influenced by the structure of the patterned first metallization material 303, as mentioned before.

In one or more embodiments, residues of the patterned first metallization material 303 that remain over the surface 312a of the semiconductor body 312 after the heating process may be removed, similarly as described above in connection with FIG. 3D.

Figure 4G:
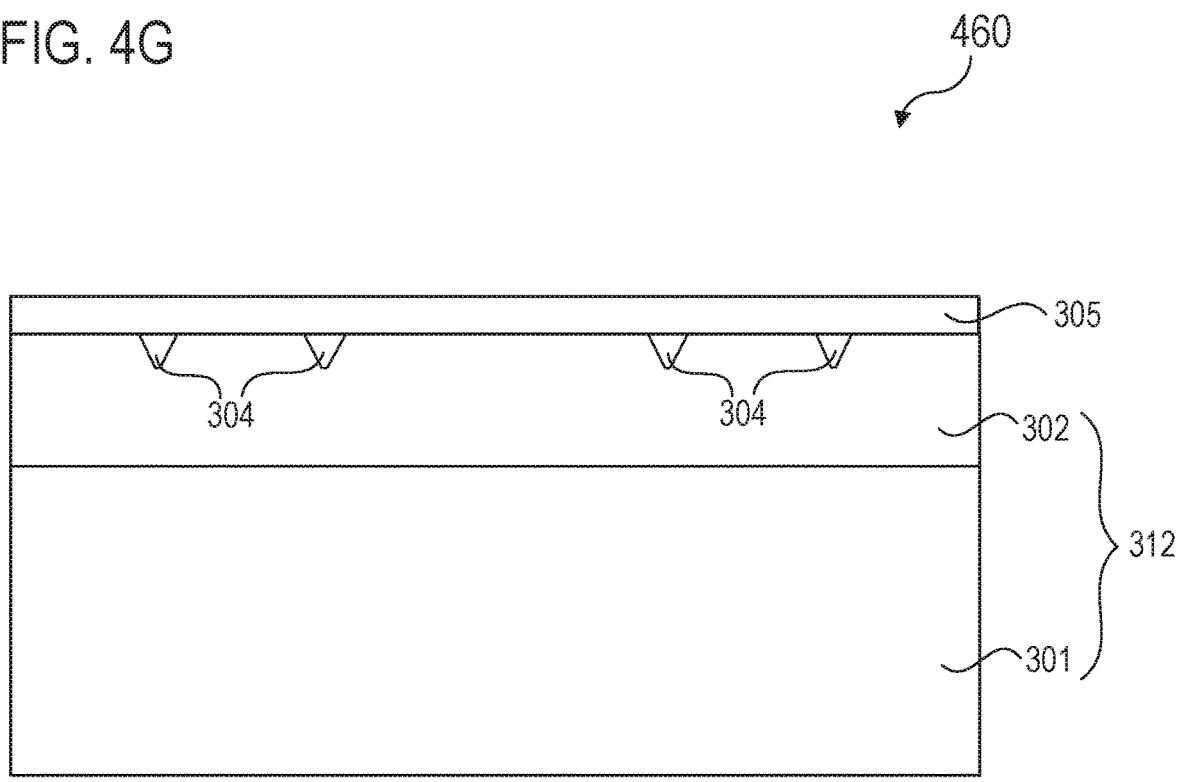

FIG. 4G shows, in a view 460, that a second metallization material 305 may be deposited over the semiconductor body 312 including region or regions 304. In one or more embodiments, the second metallization material 305 may include or may be a barrier layer material. The second metallization material 305 may be deposited and/or configured in accordance with one or more embodiments described herein, for example in a similar manner as described herein above in connection with FIG. 3E.

Figure 4H:
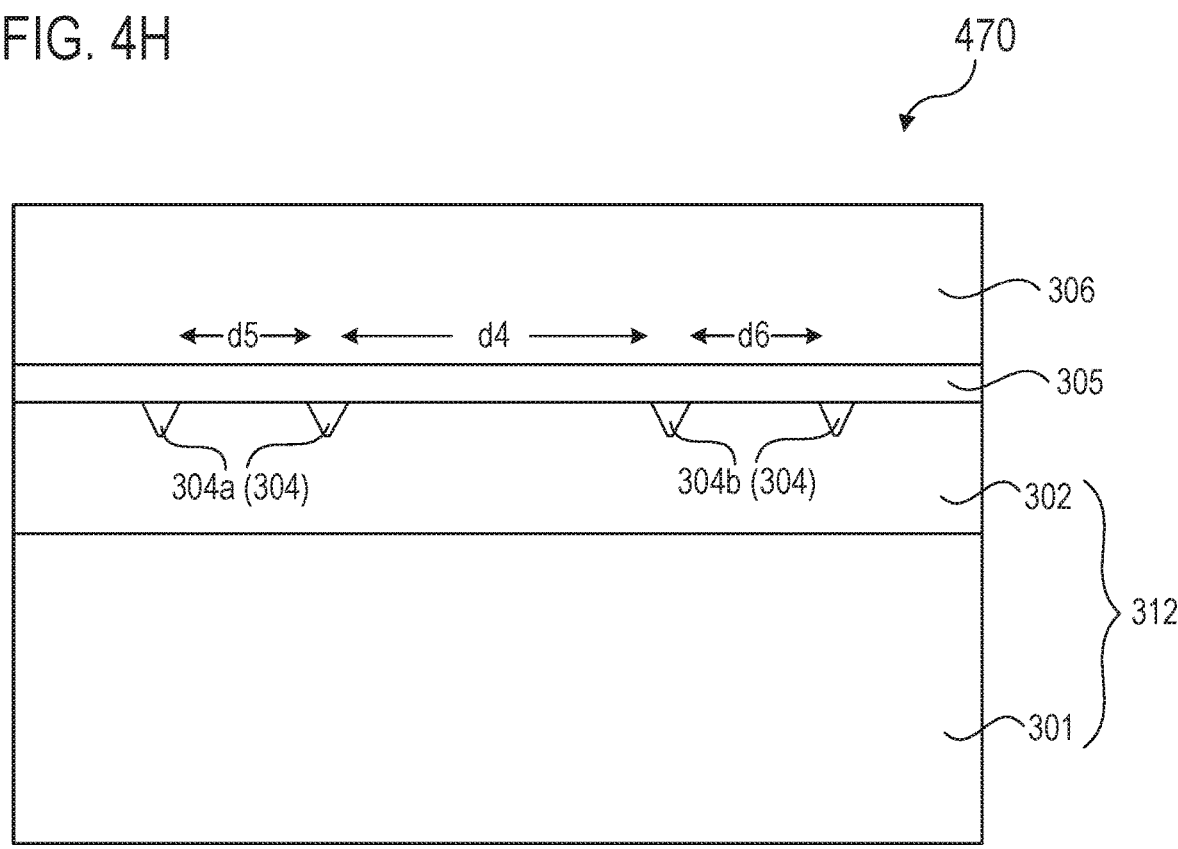

FIG. 4H shows, in a view 470, that in accordance with some embodiments, a third metallization material 306 may be deposited over the second metallization material 305. For example, in one or more embodiments, the second metallization material 305 and the third metallization material 306 may represent, respectively, a diffusion barrier layer and a metallization layer. The third metallization material 306 may be deposited and/or configured in accordance with one or more embodiments described herein, for example in a similar manner as described herein above in connection with FIG. 3F.

Illustratively, FIG. 4H shows a semiconductor device in accordance with various embodiments. The semiconductor device may include a first plurality (or group) of (e.g., spike-shaped) regions 304a and a second plurality (or group) of (e.g., spike-shaped) regions 304b formed in the semiconductor body 312 and separated by a distance d4 that may be substantially larger than a distance d5 between neighboring regions 304a of the first plurality of regions 304a and/or a distance d6 between neighboring regions 304b of the second plurality of regions 304b. In one or more embodiments, distance d4 may correspond to distance d2. In one or more embodiments, distance d5 and/or distance d6 may correspond to distance d3. In one or more embodiments, distances d5 and d6 may be the same, or substantially the same. In one or more embodiments, distances d5 and d6 may be different.

In accordance with some embodiments, as described herein above, a patterned layer of a first metallization material may be formed over a semiconductor body by means of deposition and subsequent etching of the first metallization material. In accordance with other embodiments, a patterned layer of a first metallization material may be obtained by a lift-off process, as is shown in FIG. 5A to 5D which illustrate various stages in a method for processing a semiconductor device in accordance with various embodiments.

Figure 5A:
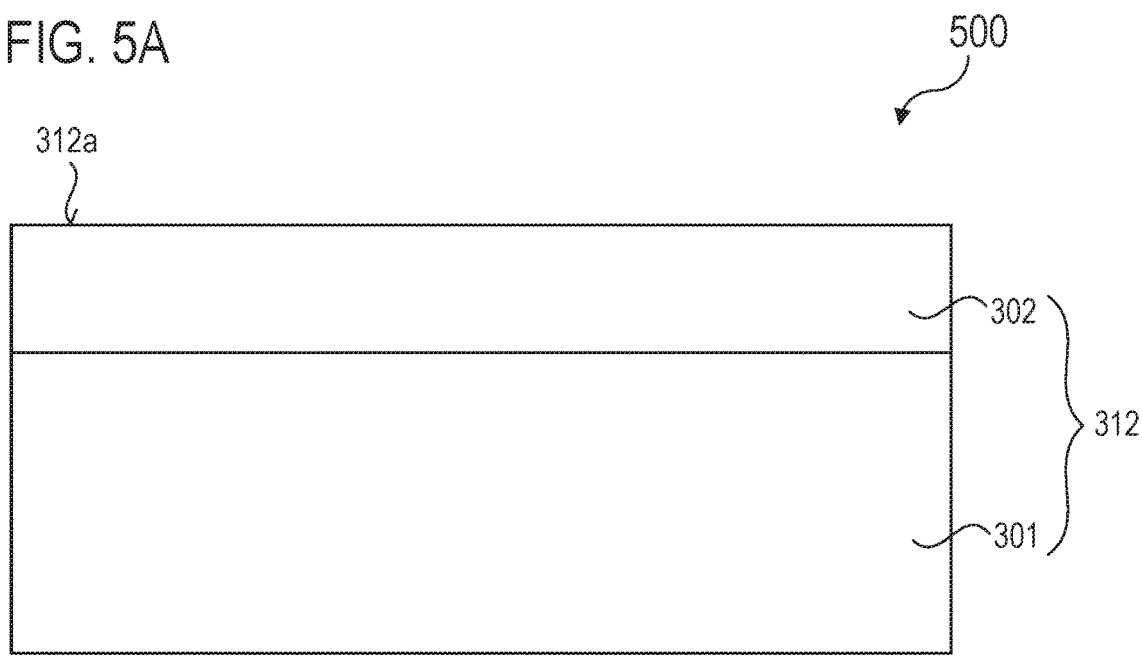
FIG. 5A to FIG. 5D are various views illustrating processing stages in a method for processing a semiconductor device in accordance with various embodiments.

FIG. 5A shows, in a view 500, that a semiconductor body 312 may be provided. The semiconductor body 312 may be configured in the same or a similar manner as the semiconductor body 312 shown in FIG. 4A, e.g. including a first semiconductor layer 301 and a second semiconductor layer 302 disposed over the first semiconductor layer 301, as shown.

Figure 5B:
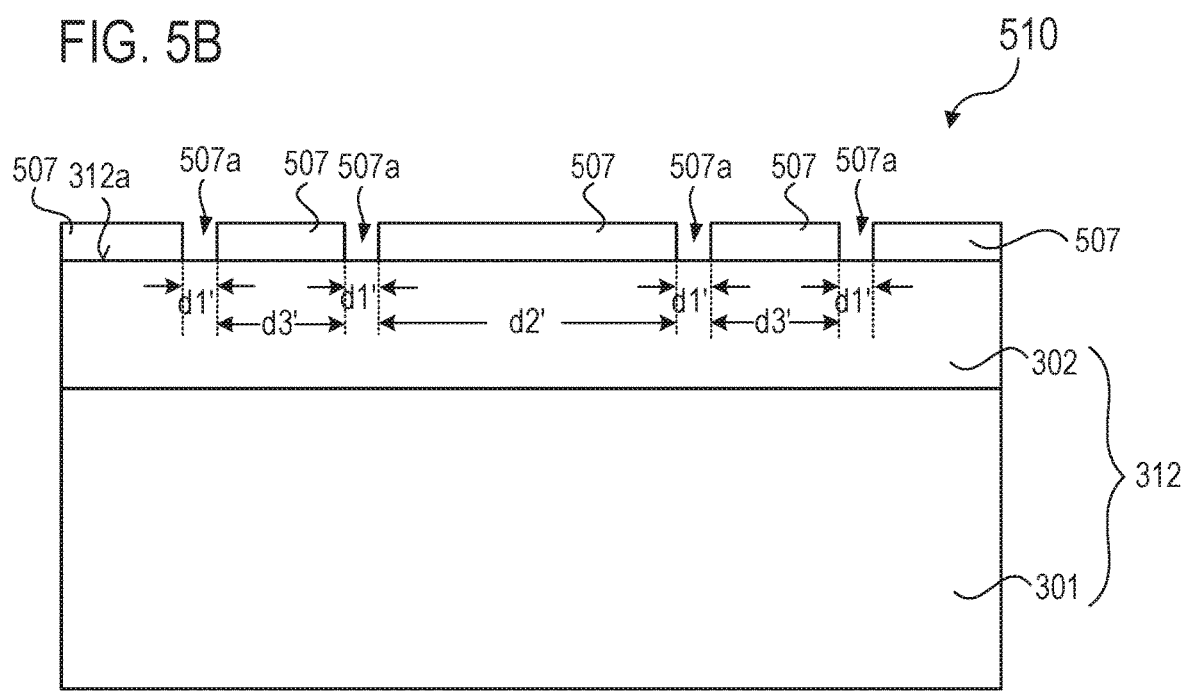

FIG. 5B shows, in a view 510, that a mask 507 may be formed over the semiconductor body 312. The mask 507 may be configured as a lift-off layer that may be removed in a lift-off process. In one or more embodiments, the mask 507 may be formed by depositing a photoresist layer, and patterning the photoresist layer by means of photolithography. The mask 507 may include at least one opening 507a, e.g. a plurality of openings 507a, that expose(s) one or more portions of the semiconductor body 312 and cover(s) one or more portions of the semiconductor body 312. The openings 507a may all have the same, or at least substantially the same, diameter, e.g. diameter d1' shown in FIG. 5B, or they may have different diameters. In one or more embodiments, diameter d1' may correspond to a diameter of a portion of first metallization material 303 subsequently formed on the semiconductor body 312, as will be described herein below. In one or more embodiments, diameter d1' may correspond to diameter d1 shown in FIG. 4C.

The portions of the semiconductor body 312 that are covered by the mask 507 may all have the same, or at least substantially the same, diameter, or they may have different diameters, e.g. diameters d2' and d3' shown in FIG. 5B. The diameter of a portion of the semiconductor body 312 that is covered by the mask 507, e.g. diameters d2' and d3', may correspond to a distance between two neighboring openings 507a of the mask 507. In one or more embodiments, diameter d2' may correspond to diameter d2 shown in FIG. 4C and/or diameter d3' may correspond to diameter d3 shown in FIG. 4C.

In one or more embodiments, the mask 507 may form a periodic structure having a plurality of openings 507a spaced at regular intervals.

The mask 507, e.g. the size, shape, and/or intervals between the openings 507a, may be predetermined to obtain a desired design (e.g., desired size and/or distance) of spike-shaped regions that may be formed later from the first metallization material 303 and material of the semiconductor body 312, as will be described herein below.

Figure 5C:
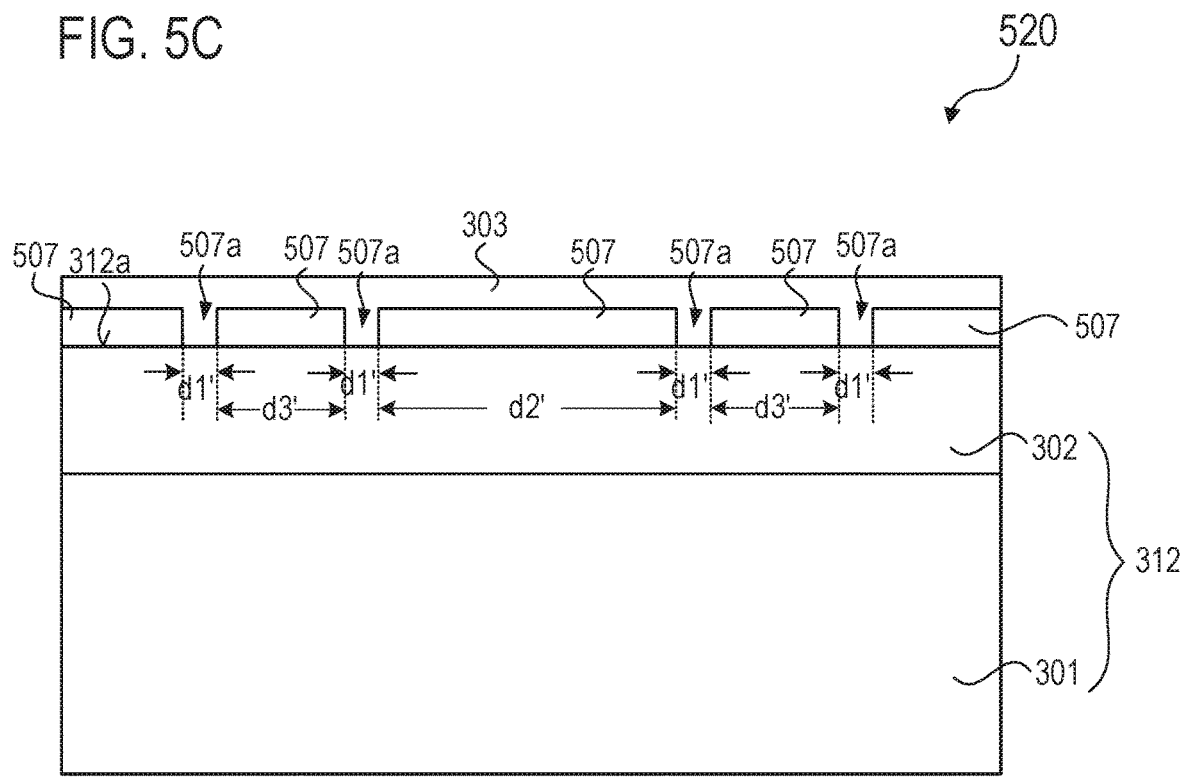

FIG. 5C shows, in a view 520, that a first metallization material 303 may be deposited over the mask 507 and the exposed portion(s) of the semiconductor body 312. The first metallization material 303 may at least partially, e.g. completely, fill the opening(s) 507a in the mask 507 and may cover an upper surface of the mask 507, as shown.

Figure 5D:
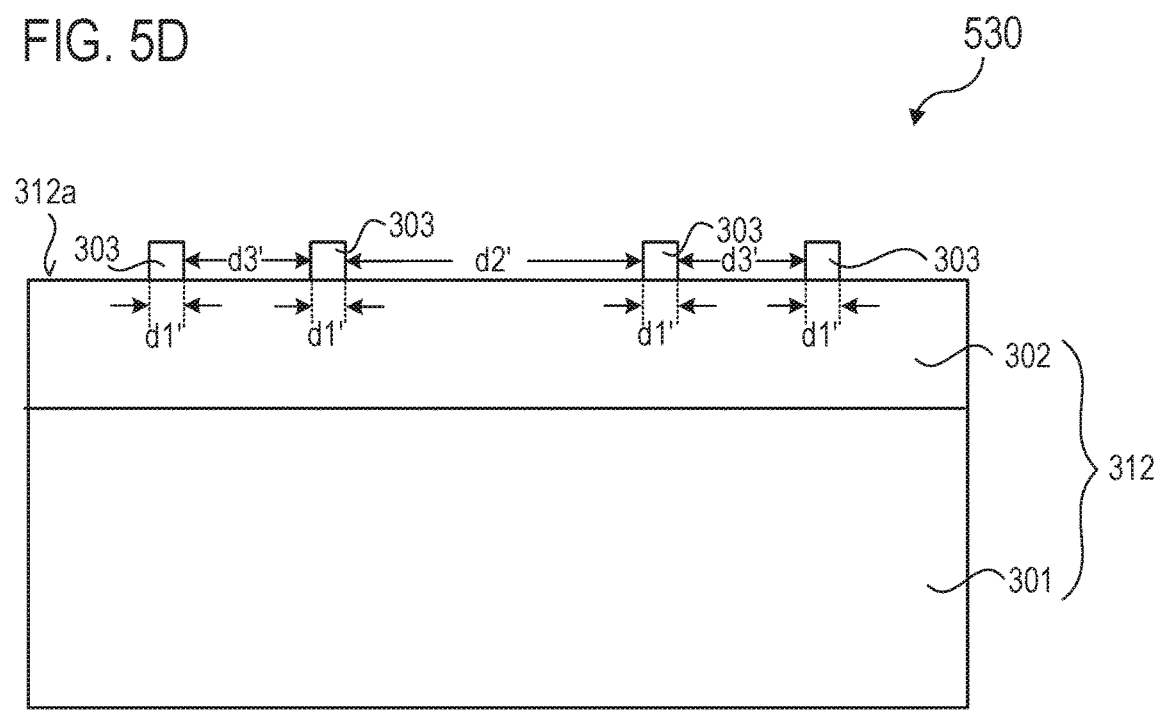

FIG. 5D shows, in a view 530, that the mask 507 and portions of the first metallization material 303 covering the mask 507 may be removed through a lift-off process, wherein portions of the first metallization material 303 that are disposed on the semiconductor body 312, e.g. on the second semiconductor layer 302 as shown, may remain. The portions of the first metallization material 303 that remain may all have the same diameter, e.g. diameter d1' as shown, or they may have different diameters. The distance between two neighboring portions of the first metallization material 303 may be the same in each case, or there may be different distances, e.g. distances d2' and d3' as shown.

The arrangement shown in FIG. 5D may be similar to the arrangement shown in FIG. 4E, and in accordance with one or more embodiments, processing of the semiconductor device may continue in a similar manner as described herein above in connection with FIG. 4F to 4H.

An aspect of various embodiments may be seen in that a first metallization (e.g., an aluminum metallization) may be deposited initially onto a semiconductor (e.g. silicon) prior to applying a second metallization (e.g., barrier layer or thick (e.g., Cu) metallization) onto the semiconductor (e.g., silicon), which may melt only at relatively high temperatures and/or form a Schottky contact with the semiconductor (e.g., silicon), thereafter a tempering process may be carried out, which may cause spike formation of the first metallization (e.g., aluminum metallization) in the semiconductor, and subsequently the first metallization (e.g., aluminum metallization) may be removed again from the semiconductor surface such that the (e.g., aluminum) spikes remain in the semiconductor. In this case, since after depositing the second metallization the (e.g., aluminum) spikes may be in direct contact with the second metallization, an ohmic contact to the semiconductor (e.g. silicon) may be provided via the spikes, even if the second metallization (e.g., barrier metallization or thick (e.g., Cu) metallization) contacting directly the semiconductor surface forms a Schottky contact to the semiconductor surface. Thus, a (local) ohmic contact to the semiconductor surface may be provided with any metallization, with the density and depth of the contact spikes being able to be determined by means of the metallization tempering. With a sufficient density of these ohmic shunts the undesirable effects of a Schottky contact may be substantially avoided.

In one or more embodiments, temperatures for the metallization tempering may be in the range from 330° C. to 480° C., e.g. in the range from 350° C. to 420° C. In one or more embodiments, tempering time durations may be in the range from 15 minutes to 2 hours, e.g. in the range from 15 minutes to 1 hour. In one or more embodiments, a barrier layer (in other words, a layer including or being made of a barrier material) may be deposited for the spike formation before depositing the (e.g., aluminum) metallization. The barrier layer may be patterned before the tempering in order to create a desired spike design, for example to influence the distance and/or size of the spikes.

In accordance with some embodiments, ohmic shunts (in other words, ohmic parallel connections) may be formed parallel to Schottky contacts by forming (e.g., aluminum) spikes, which may be in direct contact with an arbitrary metallization subsequently deposited on top.

A semiconductor device in accordance with various embodiments may include: a semiconductor body (e.g., semiconductor body 312), at least one region in the semiconductor body including a eutectic of a first metallization material and material of the semiconductor body (e.g., region(s) 304); and a second metallization material disposed over the semiconductor body and in contact with the at least one region in the semiconductor body (e.g., second metallization material 305).

In one or more embodiments, the at least one region may have a spike shape. In other words, the at least one region may be a spike-shaped region.

In one or more embodiments, the at least one region (e.g. spike-shaped region) may extend from a surface (e.g., surface 312a) of the semiconductor body into the semiconductor body.

In one or more embodiments, the at least one region (e.g. spike-shaped region) may extend to a depth of about 50 nm to about 1 nm, measured from the surface (e.g., surface 312a) of the semiconductor body, e.g. to a depth of about 100 nm to about 1 nm in one or more embodiments, e.g. a depth of about 100 nm to about 600 nm in one or more embodiments, e.g. a depth of about 200 nm to about 600 nm in one or more embodiments.

In one or more embodiments, the at least one region (e.g. spike-shaped region) may have a first diameter (e.g., diameter "b" in FIG. 3C) at or proximate the surface of the semiconductor body and a second diameter (e.g., diameter "c" in FIG. 3C) distant from the surface of the semiconductor body, wherein the first diameter may be larger than the second diameter.

In one or more embodiments, the first diameter of the at least one region (e.g. spike-shaped region) at or proximate the surface of the semiconductor body may be in the range from about 200 nm to about 2 µm, e.g. in the range from about 400 nm to about 1.5 µm, e.g. in the range from about 600 nm to about 2 µm.

In one or more embodiments, a distance (e.g., distance "a" in FIG. 3C) between at least two neighboring spike-shaped regions of the plurality of spike-shaped regions may be in the range from about 1 µm to about 100 µm, e.g. in the range from about 3 µm to about 15 µm.

In one or more embodiments, a distance (e.g., distance d4 in FIG. 4H) between a first pair of neighboring spike-shaped regions of the plurality of spike-shaped regions may be different from a distance (e.g. distance d5 and/or d6 in FIG. 4H) between a second pair of neighboring spike-shaped regions of the plurality of spike-shaped regions.

In one or more embodiments, a density of the plurality of spike-shaped regions may be in the range from about 5 spikes per 100 µm$^2$ to about 100 spikes per 100 µm$^2$, e.g. in the range from about 10 spikes per 100 µm$^2$ to about 50 spikes per 100 µm$^2$, e.g. in the range from about 20 spikes per 100 µm$^2$ to about 100 spikes per 100 µm$^2$, e.g. in the range from about 5 spikes per 100 µm$^2$ to about 20 µm$^2$.

In one or more embodiments, the first metallization material may include or may be a material that forms a eutectic with the material of the semiconductor body at a temperature of less than or equal to about 600° C.

In one or more embodiments, the first metallization material may have a lower work function than the second metallization material.

In one or more embodiments, the first metallization material may have a work function of less than or equal to about 6 eV, e.g. less than or equal to about 5 eV, for example in the range from about 3 eV to 6 eV, e.g. in the range from about 4 eV to 5 eV, e.g. about 4.4 eV.

In one or more embodiments, the first metallization material may be selected such that a Schottky barrier between the first metallization material and the material of the semiconductor body is lower than a Schottky barrier between the second metallization material and the material of the semiconductor body.

In one or more embodiments, a Schottky barrier between the first metallization material and the material of the semiconductor body may be less than or equal to about 1 eV, for example in the range from about 0.2 eV to about 1 eV.

In one or more embodiments, the at least one region in the semiconductor body including the eutectic may form an ohmic contact to the semiconductor body.

In one or more embodiments, the first metallization material may include or may be at least one material selected from a group of materials, the group consisting of: aluminum, gold-tin, tin, indium.

In one or more embodiments, the second metallization material may include or may be a refractory metal or metal alloy.

In one or more embodiments, the second metallization material may include or may be a barrier layer material.

In one or more embodiments, the second metallization material may include or may be at least one material selected from a group of materials, the group consisting of: titanium-tungsten, titanium-nitride, tantalum-nitride, titanium-tantalum, titanium tungsten nitride, ruthenium.

In one or more embodiments, the second metallization material may include or may be at least one material selected from a group of materials, the group consisting of: copper, aluminum.

In one or more embodiments, the semiconductor device may further include a third metallization material (e.g., third metallization material 306) disposed over the second metallization material.

In one or more embodiments, the second metallization material may include or may be at least one material selected from a group of materials, the group consisting of: titanium-tungsten, titanium-nitride, tantalum-nitride, and titanium-tantalum; and the third metallization material may include or may be at least one material selected from a group of materials, the group consisting of: copper, aluminum.

In one or more embodiments, the at least one region (e.g. spike-shaped region) may have an inverse pyramid like shape.

In one or more embodiments, the inverse pyramid like shape may have a base diameter in the range from about 200 nm to about 2 µm, e.g. in the range from about 400 nm to about 1.5 µm in one or more embodiments, e.g. in the range from about 600 nm to about 2 µm in one or more embodiments.

In one or more embodiments, the semiconductor body, or at least one semiconductor layer of the semiconductor body, may include or may be made of silicon.

In one or more embodiments, the semiconductor body, or at least one semiconductor layer of the semiconductor body, may be doped, e.g. p-doped or n-doped.

In one or more embodiments, the semiconductor body, or at least one semiconductor layer of the semiconductor body, may have a dopant concentration of less than or equal to about $5\times10^{13}$ cm$^{-3}$, for example in the range from about $3\times10^{12}$ cm$^{-3}$ to about $1\times10^{14}$ cm$^{-3}$, for example in the range from about $5\times10^{12}$ cm$^{-3}$ to about $1\times10^{14}$ cm$^{-3}$.

The semiconductor device, or parts thereof, may further be configured in accordance with one or more embodiments described herein.

A method for processing a semiconductor device in accordance with various embodiments may include: depositing a first metallization material having a first work function over a semiconductor layer; performing a heating process so as to form at least one spike-shaped region from the first metallization material and material of the semiconductor layer, the at least one spike-shaped region extending from a surface of the semiconductor layer into the bulk of the semiconductor layer; removing residues of the first metallization material from above the semiconductor layer; and depositing a second metallization material having a second work function over the semiconductor layer so as to electrically contact the semiconductor layer with the second metallization material via the at least one spike-shaped region, wherein the first work function is lower than the second work function.

A method for processing a semiconductor device in accordance with various embodiments may include: depositing a first metallization material containing aluminum over a surface of a silicon layer; performing a heating process so as to form at least one spike-shaped region extending from the surface of the silicon layer into the bulk of the silicon layer and containing an aluminum silicon eutectic; and depositing a second metallization material over the surface of the silicon layer so as to electrically contact the silicon layer with the second metallization material via the at least one spike-shaped region.

While various aspects of this disclosure have been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A semiconductor device, comprising:
   a semiconductor body;
   a plurality of regions in the semiconductor body each comprising a eutectic of a first metallization material and material of the semiconductor body, wherein at least two of the plurality of regions are non-contiguous and neighboring regions separated by one or more portions of the semiconductor body; and
   a second metallization material disposed over the semiconductor body,
   wherein the plurality of regions comprises a first region non-contiguous to a second region neighboring the first region and wherein the plurality of regions are spike-shaped regions, and
   wherein the second metallization covers and contacts the first region, the second region, and a portion of the semiconductor body separating the first region from the second region.

2. The semiconductor device of claim 1, wherein at least one of the plurality of spike-shaped regions extends to a depth of about 100 nm to about 1 µm, measured from a surface of the semiconductor body.

3. The semiconductor device of claim 1, wherein at least one of the plurality of spike-shaped regions has a first diameter proximate a surface of the semiconductor body and a second diameter distant from the surface of the semiconductor body, wherein the first diameter is larger than the second diameter.

4. The semiconductor device of claim 1, wherein a diameter of at least one of the plurality of spike-shaped regions at a surface of the semiconductor body is in a range from about 200 nm to about 2 µm.

5. The semiconductor device of claim 1, wherein a distance between at least two neighboring spike-shaped regions of the plurality of spike-shaped regions is in a range from about 1 µm to about 100 µm.

6. The semiconductor device of claim 1, wherein a density of the plurality of spike-shaped regions is in a range from about 5 spikes per 100 µm$^2$ to about 100 spikes per 100 µm$^2$.

7. The semiconductor device of claim 1, wherein the first metallization material comprises a material that forms a eutectic with the material of the semiconductor body at a temperature of less than or equal to about 600° C.

8. The semiconductor device of claim 1, wherein the first metallization material has a lower work function than the second metallization material.

9. The semiconductor device of claim 1, wherein the first metallization material is a material so that a Schottky barrier between the first metallization material and a material of the semiconductor body is lower than a Schottky barrier between the second metallization material and the material of the semiconductor body.

10. The semiconductor device of claim 1, wherein the first metallization material comprises at least one material selected from a group of materials, the group consisting of: aluminum, gold-tin, tin, indium.

11. The semiconductor device of claim 1, wherein the second metallization material comprises a refractory metal or metal alloy.

12. The semiconductor device of claim 1, wherein the second metallization material comprises a barrier layer material.

13. The semiconductor device of claim 1, wherein the second metallization material comprises at least one material selected from a group of materials, the group consisting of: titanium-tungsten, titanium-nitride, tantalum-nitride, titanium-tantalum, titanium tungsten nitride, and ruthenium.

14. The semiconductor device of claim 1, wherein the second metallization material comprises at least one material selected from a group of materials, the group consisting of: copper, aluminum.

15. The semiconductor device of claim 1, further comprising a third metallization material disposed over the second metallization material.

16. The semiconductor device of claim 1, wherein at least one spike-shaped region has an inverse-pyramid-like shape.

17. The semiconductor device of claim 1, wherein the semiconductor body or at least one semiconductor layer of the semiconductor body comprises silicon.

18. The semiconductor device of claim 1, wherein the plurality of regions further comprises a third region non contiguous to the second region, and
wherein the second metallization material further contacts and covers the third metallization region and a portion of the semiconductor body separating the third region from the second region.

19. The semiconductor device of claim 1, where the second metallization material is a continuous layer covering all the plurality of regions in the semiconductor body.

* * * * *